(12) United States Patent
Drees et al.

(10) Patent No.: US 9,471,722 B2
(45) Date of Patent: Oct. 18, 2016

(54) SYSTEMS AND METHODS FOR EVALUATING A FAULT CONDITION IN A BUILDING

(71) Applicant: Johnson Controls Technology Company, Holland, MI (US)

(72) Inventors: Kirk H. Drees, Cedarburg, WI (US); Michael J. Wenzel, Oak Creek, WI (US)

(73) Assignee: Johnson Controls Technology Company, Plymouth, MI (US)

( * ) Notice: Subject to any disclaimer, the term of this patent is extended or adjusted under 35 U.S.C. 154(b) by 704 days.

(21) Appl. No.: 13/759,933

(22) Filed: Feb. 5, 2013

(65) Prior Publication Data

US 2014/0222394 A1    Aug. 7, 2014

(51) Int. Cl.
*G06G 7/48* (2006.01)
*G06F 17/50* (2006.01)
*G06Q 10/06* (2012.01)

(52) U.S. Cl.
CPC ....... *G06F 17/5009* (2013.01); *G06Q 10/0635* (2013.01)

(58) Field of Classification Search
CPC ........ G06F 17/10; G06F 17/50; G06F 19/00; G06F 1/32; G06F 17/5009; G06G 7/48; G06G 7/63; G06N 5/02; G06Q 50/00; G06Q 30/00; G01R 21/00
See application file for complete search history.

(56) References Cited

U.S. PATENT DOCUMENTS

| | | | |
|---|---|---|---|
| 2011/0178977 A1* | 7/2011 | Drees | 706/52 |
| 2011/0251933 A1* | 10/2011 | Egnor et al. | 705/30 |
| 2011/0257911 A1* | 10/2011 | Drees et al. | 702/61 |
| 2012/0330626 A1* | 12/2012 | An | G01K 17/20 703/2 |
| 2013/0151179 A1* | 6/2013 | Gray | 702/62 |
| 2014/0129197 A1* | 5/2014 | Sons et al. | 703/7 |

OTHER PUBLICATIONS

Basarkar et al., Modeling and Simulation of NVAC Results in EnergyPlus, Nov. 2011, 10 pages.
Brown et al., Techniques for Testing the Constancy of Regression Relationships over Time, http://www.jstor.org/stable/2984889, retrieved on Feb. 13, 2011, 45 pages.
Crawley, EnergyPlus: DOE's Next Generation Simulation Program, Feb. 16, 2010, 43 pages.
EWMA Chart, en.wikipedia.org/wiki/EWMA_chart, retrieved on Dec. 7, 2012, 2 pages.
Kissock et al., Inverse Modeling Toolkit: Numerical Algorithms, 2003, 9 pages.
Lammers et al., Measuring Progress with Normalized Energy Intensity, 2011, 11 pages.
Lee et al., Remote Fault Detection of Building HVAC System Using a Global Optimization Program, May 2004, 12 pages.
Radiative Cooling, en.wikipedia.org/wiki/Radiative_cooling, retrieved on Jul. 20, 2012, 3 pages.
Sever et al., Estimating Industrial Building Energy Savings using Inverse Simulation, ASHRAE2011-86073, 8 pages.
Smith, Establishing a Baseline with Lean Energy Analysis, Oct. 10, 2011, 29 pages.
Technology Methodology for House of Worship, ENERGY STAR Performance Ratings, Aug. 2009, 11 pages.
Typical Meteorological Year, en.wikipedia.org/wiki/Typical_meteorological_year, retrieved on Jul. 20, 2012, 2 pages.
Wilcox et al., Users Manual for TMY3 Data Sets, Apr. 2008, 56 pages.

* cited by examiner

*Primary Examiner* — Kandasamy Thnagavelu
(74) *Attorney, Agent, or Firm* — Foley & Lardner LLP

(57) ABSTRACT

Systems and methods for evaluating a fault condition in a building include determining a change to energy use model parameters attributable to the fault condition. The change to the energy use model parameters are used to calculate a corresponding change to the building's energy consumption.

30 Claims, 18 Drawing Sheets

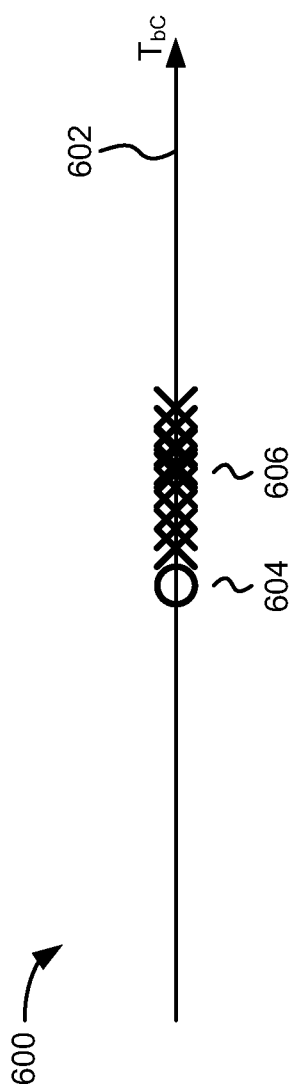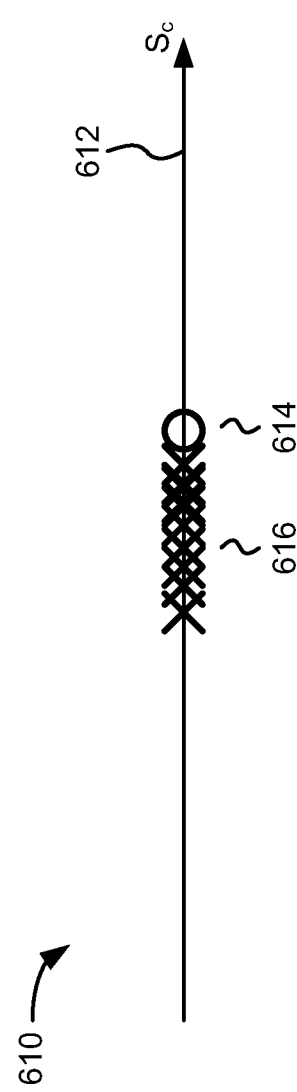

SYSTEMS AND METHODS FOR EVALUATING A FAULT CONDITION IN A BUILDING

BACKGROUND

The present disclosure generally relates to systems and methods for evaluating a fault condition in a building.

Many commercial buildings today are equipped with a variety of energy-consuming devices. For example, a commercial building may be equipped with various heating, ventilation, and air conditioning (HVAC) devices that consume energy to regulate the temperature in the building. Other exemplary types of building equipment that consume energy may include lighting fixtures, security equipment, data networking infrastructure, and other such equipment.

The energy efficiency of commercial buildings has become an area of interest in recent years. In many areas of the world, commercial buildings consume a good portion of the generated electricity available on an electric grid. For an energy provider, the energy efficiency of commercial buildings that it services helps to alleviate strains placed on the provider's electrical generation and transmission assets. For a building's operator, energy efficiency corresponds to greater financial savings, since less energy is consumed by the building.

A building fault presents one potential cause for a building's energy consumption to be higher than normal. For example, a building's HVAC system may include an outdoor air damper that regulates the amount of outdoor air that enters the building. On a hot day, the building's HVAC system may take in outdoor air via the outdoor air damper, chill the received air, and use the chilled air to provide cooling to the internal areas of the building. However, if the outdoor air valve is stuck fully open (e.g., a fault exists), the building's HVAC system may receive a greater volume of hot outdoor air than is needed to regulate the internal temperature of the building. In such a case, the building's HVAC system may consume more energy than is needed to chill the additional hot air.

It is challenging and difficult to analyze the impact of a building fault on the energy consumption of the building and its corresponding financial impact.

SUMMARY

One embodiment relates to a method for evaluating a change in a building's energy use. The method includes receiving an identifier for a change to the building. The method also includes determining, by a processing circuit, a change in building energy use model parameters that result from the change to the building, the building energy use model parameters being used in an energy use model that models the energy consumption of the building. The method further includes calculating, by the processing circuit, a change to the energy consumption of the building using the building energy use model and the change to the building energy use model parameters that result from the change to the building.

Another embodiment relates to a method for diagnosing the cause of a change in building energy use model parameters for a building. The method includes determining, by the processing circuit, a mapping from a change to the building to the change in building energy use model parameters. The method also includes receiving an estimate and covariance matrix for the change in building energy use model parameters. The method further includes projecting the change in building energy use model parameters onto a direction defined by a relation between the change in building energy use model parameters and the change to the building. The method also includes determining, by the processing circuit, the estimate and variance of the change in building energy use model projected onto a direction described by the mapping from the change to the building to the change in building energy use model parameters. The method additionally includes determining, by the processing circuit, a ratio of the mean to standard deviation of the projection for the direction.

An additional embodiment relates to a system for evaluating a change in a building's energy use. The system includes a processing circuit configured to receive an identifier for a change in the building. The processing circuit is also configured to determine a change in building energy use model parameters that result from the change in the building, the building energy use model parameters being used in an energy use model that models the energy consumption of the building. The processing circuit is additionally configured to calculate a change in the energy consumption of the building using the energy use model and the change in the building energy use model parameters that result from the change to the building.

A further embodiment relates to a system for diagnosing the cause of a change in building energy use model parameters for a building. The system includes a processing circuit configured to determine a mapping from a change to the building to the change in building energy use model parameters. The processing circuit is also configured to receive an estimate and covariance matrix for the change in building energy use model parameters. The processing circuit is further configured to project the change in building energy use model parameters onto a direction defined by a relation between the change in building energy use model parameters and the change to the building. The processing circuit is also configured to determine the estimate and variance of the change in building energy use model parameters projected onto a direction described by the mapping from the change to the building to the change in building energy use model parameters. The processing circuit is yet further configured to determine a ratio of the mean to standard deviation of the projection for the direction corresponding to the change to the building.

Yet another embodiment relates to a method for relating changes in heat transfer related parameters for a building to changes in building energy use model parameters for the building. The heat transfer related parameters represent physical changes to the building. The method includes receiving changes in the heat transfer related parameters and receiving changes in the building energy use model parameters. The method also includes determining, by a processing circuit, a mapping between the heat transfer related parameters and the building energy use model parameters. The method also includes determining, by a processing circuit, a new change to the heat transfer related parameters that results from a fault condition. The method also includes using the new change in the heat transfer related parameters that results from the fault condition and the mapping to determine a corresponding new change in the building energy use model parameters. The method also includes determining, by the processing circuit, a change to an energy consumption that results from the fault condition based on the new change in the building energy use model parameters.

Alternative exemplary embodiments relate to other features and combinations of features as may be generally recited in the claims.

BRIEF DESCRIPTION OF THE FIGURES

The disclosure will become more fully understood from the following detailed description, taken in conjunction with the accompanying figures, wherein like reference numerals refer to like elements, in which:

FIGS. 6A-6B are illustrations of temperature based energy model parameters plotted along their respective dimensions, according to various embodiments;

DESCRIPTION

Before turning to the figures, which illustrate the exemplary embodiments in detail, it should be understood that the disclosure is not limited to the details or methodology set forth in the description or illustrated in the figures. It should also be understood that the terminology is for the purpose of description only and should not be regarded as limiting.

According to various aspects of the present disclosure, a building's energy consumption may be modeled in a lean manner (e.g., using a lean energy model) such that readily-available data are used in the model. As described herein, coefficients of the lean energy model are to be understood as, and implied to be, lean energy model parameters. For example, a building's energy consumption may be modeled using data regarding the building's area, usage type (e.g., a hospital, a university building, an apartment building, etc.), weather data for the building's geographic location, and utility data (e.g., from a utility that supplies electricity to the building). Thus, the energy consumption of the building can be modeled without requiring an expensive energy audit or monitoring (e.g., detecting) every aspect of the building via deployed sensors.

Fault monetization may be achieved by determining changes in temperature based energy model parameters that result when a particular fault condition exists. The changes in the temperature based energy model parameters may then be used to determine a corresponding change in the energy consumption of the building. For example, the energy consumption of the building may increase if a particular temperature sensor is defective. This change in energy consumption may be translated into a corresponding financial value and provided as part of a report. For example, a change in the energy consumption of the building that results from a fault may be multiplied by a blended utility rate to quantify the financial cost of the fault.

Energy Consumption, Weather, and Site (EWS) Data Acquisition and Analysis

Figure 1:
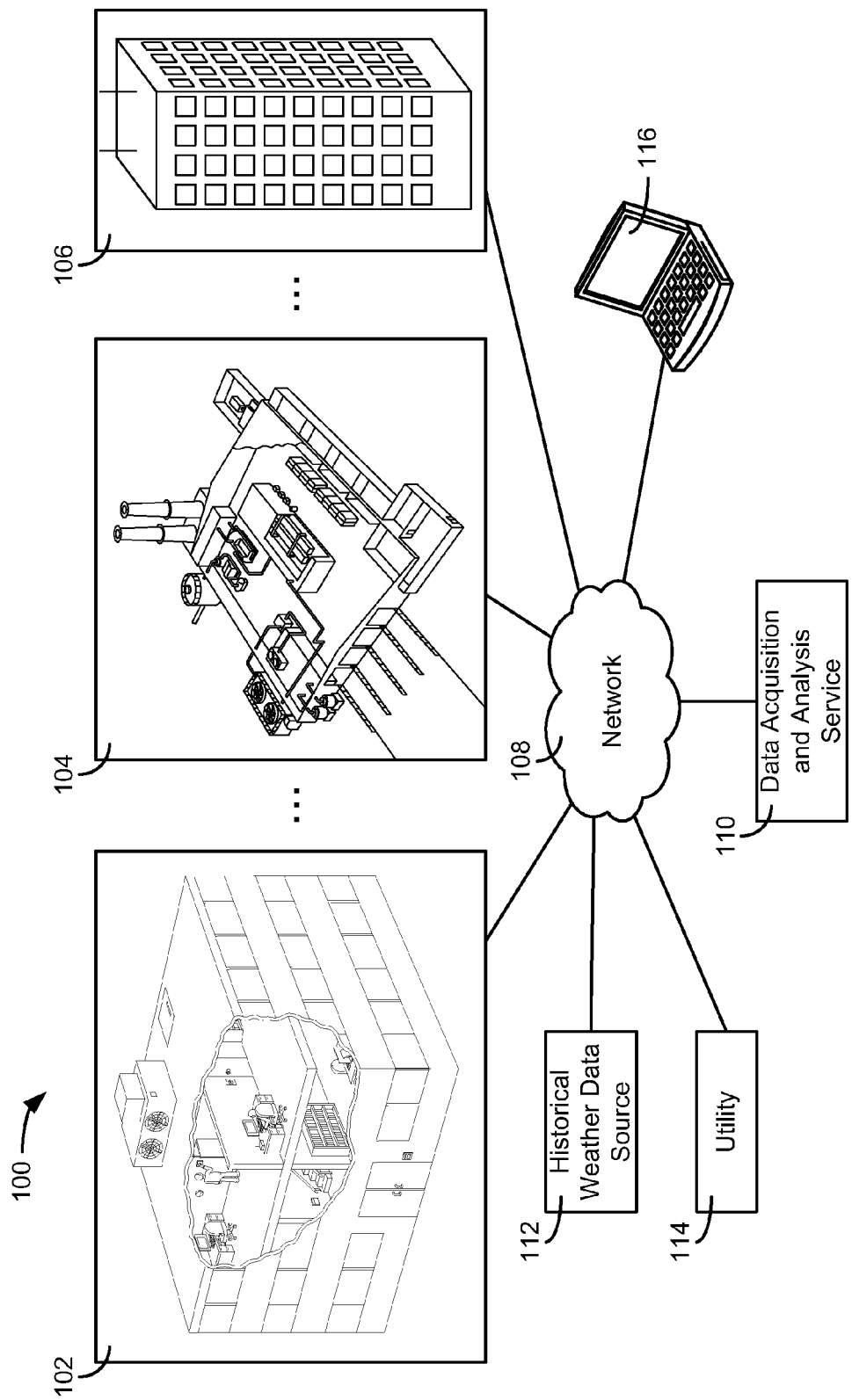
FIG. 1 is an illustration of an EWS data acquisition system, according to an exemplary embodiment.

Referring now to FIG. 1, an illustration of energy consumption, weather, and site (EWS) data acquisition system 100 is shown, according to an exemplary embodiment. Generally, EWS data acquisition system 100 is configured to record, store, and analyze EWS data related to a building's energy use. In various embodiments, EWS data for a building may be used to model the building's energy usage profile and predict related parameters (e.g., temperature based energy model parameters, etc.). Comparisons may also be made in EWS data acquisition system 100 between the EWS data and building energy use model parameters of different buildings. As defined herein, the term "building energy use model parameters" may include both lean energy model (LEM) parameters and temperature based energy model (TEM) parameters (described in greater detail below).

As shown, EWS data acquisition system 100 may include any number of buildings 102-106 (e.g., a first through nth building). Buildings 102-106 may also include any number of different types of buildings, such as various types of commercial buildings. For example, building 102 may be an office building, building 104 may be a manufacturing facility, and building 106 may be a hospitality facility, such as a hotel. Other exemplary buildings in buildings 102-106 may include, but are not limited to, data centers, schools, shipping facilities, and government buildings. Buildings 102-106 may include any combination of the different building types. For example, buildings 102-106 may include ten office buildings, twenty manufacturing facilities, and thirty hospitality facilities.

Buildings 102-106 may be located within the same geographic regions as one another or across different geographic regions. For example, building 102 and building 104 may be located in the same city, while building 106 may be located in a different city. Different levels of granularity may be used to distinguish buildings 102-106 as being located in the same geographic region. For example, geographic regions may be divided by country, state, city, metropolitan area, time zone, zip code, area code, latitude, longitude, growing zone, combinations thereof, or using any other geographic classification system. According to one embodiment, a building's geographic location may be used as a proxy for its climatic zone. For example, data regarding a building's location in Hawaii may be used to determine that the building is located in a tropical climate.

Buildings 102-106 may be equipped with sensors and other monitoring devices (e.g., detecting devices) configured to measure EWS data related to the energy consumption of the building. For example, buildings 102-106 may have devices (e.g., computing devices, power meters, etc.) configured to measure the water consumption, energy consumption, and energy demand of the buildings. Other forms of EWS data may include the measured temperature in the zones of a building, the dimensions of the building (e.g., square footage, etc.) and any other measured value that relates to the building's energy usage profile. In some cases, EWS data may also include data used in a building's automation system. For example, EWS data may also include control parameters, such as temperature set points used to regulate the temperate in a building and timing data used to automatically turn on or off parts of the lighting within the building at various times (e.g., the lights may be turned off in an area of the building at night).

According to various embodiments, readily available data may be used to determine and model an energy consumption of the building. For example, billing data may be received from a utility 114 (e.g., billing data from the utility) that indicates the energy consumption of the building, the financial costs associated with the energy consumption, etc. In keeping with the principles of lean energy analysis, lean energy model parameters such as billing data from a utility and other forms of readily available data may be used to model and analyze an energy consumption of the building. Such an approach may simplify and reduce the cost of performing the energy analysis over approaches that rely heavily on sensor data from a building.

EWS data may include data regarding the weather where a building is located. In some embodiments, the weather data may be generated by weather-sensing equipment at buildings 102-106. For example, building 104 may be equipped with temperature sensors that measure the building's external temperature. In some embodiments, EWS data may include weather data received from a weather data source located in proximity to the building. In further embodiments, EWS data may include weather data for a typical meteorological year (TMY) received from a historical weather data source 112 (e.g., a computer system of the National Oceanic and Atmospheric Administration or similar data source). In the United States of America, the first set of TMY data was collected between 1948-1980 from various locations throughout the country. A second set of TMY data (TMY2), which also includes data regarding precipitable moisture, was collected between 1961-1990. In addition, a third set of TMY data (TMY3), was collected from many more locations than TMY2 data over the span of 1976-1995. Regardless of the version used, TMY data may be used to compare current conditions to normal or predicted conditions, in some embodiments. In further embodiments, TMY data may be used to predict future conditions of a building (e.g., by using the historical data to predict typical future weather conditions) or future energy consumptions by a building. For example, TMY data may be used to predict an average outdoor temperature change for a building during the upcoming month of March. TMY data may be stored by the building automation systems of buildings 102-106 or data acquisition and analysis service 110 and used to model the heating and cooling needs of buildings 102-106. As used herein, "TMY data" may refer to any version or set of TMY data (e.g., TMY2 data, TMY3 data, etc.).

Network 108 may be any form of computer network that relays information between buildings 102-106 and a data acquisition and analysis service 110. For example, network 108 may include the Internet and/or other types of data networks, such as a local area network (LAN), a wide area network (WAN), a cellular network, satellite network, or other types of data networks. Network 108 may also include any number of computing devices (e.g., computer, servers, routers, network switches, etc.) that are configured to receive and/or transmit data within network 108. Network 108 may further include any number of hardwired and/or wireless connections. For example, building 102 may communicate wirelessly (e.g., via WiFi, ZigBee, cellular, radio, etc.) with a transceiver that is hardwired (e.g., via a fiber optic cable, a CAT5 cable, etc.) to other computing devices in network 108.

Data acquisition and analysis service 110 may be one or more electronic devices connected to network 108 configured to receive EWS data regarding buildings 102-106 (e.g., either directly from buildings 102-106 or from another computing device connected to network 108). In various embodiments, data acquisition and analysis service 110 may be a computer server (e.g., an FTP server, file sharing server, web server, etc.) or a combination of servers (e.g., a data center, a cloud computing platform, etc.). Data acquisition and analysis service 110 may also include a processing circuit configured to perform the functions described with respect to data acquisition and analysis service 110. The EWS data may be received by the processing circuit of data acquisition and analysis service 110 periodically, in response to a request for the data from data acquisition and analysis service 110, in response to receiving a request from a client device 116 (e.g., a user operating client device 116 may request that the EWS data be sent by the computing device), or at any other time.

Data acquisition and analysis service 110 may be configured to model the energy usage profiles of buildings 102-106 using the received EWS data, according to various embodiments. For example, data acquisition and analysis service 110 may utilize lean energy analysis (e.g., using readily available data, such as utility billing data and other lean energy model parameters) to model the energy usage profiles of buildings 102-106. In some embodiments, data acquisition and analysis service 110 may use the received EWS data in an inverse building energy model that uses weather data as an independent variable and energy bill data divided by the area of the building as the dependent variable. In other words, the model may make use of other lean energy model parameters such as historical weather data to predict the energy costs for the building using lean energy analysis. Data acquisition and analysis service 110 may also generate and provide various reports to client 116, which may be located within one of buildings 102-106 or at another location.

In other embodiments, data acquisition and analysis service 110 may be implemented at one or more of buildings 102-106. For example, data acquisition and analysis service 110 may be integrated as part of the building automation system of buildings 102-106 (e.g., as part of a distributed implementation). In such a case, EWS data may be shared by the computing devices in buildings 102-106 that implement the functions of data acquisition and analysis service 110 with one another via network 108. For example, computing devices at buildings 102-106 may be configured to collaboratively share EWS data regarding their respective building's energy consumption and demand. The sharing of EWS data among the buildings' respective computing devices may be coordinated by one or more of the devices, or by a remote coordination service. For example, a remote server connected to network 108 may coordinate the sharing of EWS data among the electronic devices located at buildings 102-106.

Figure 2:
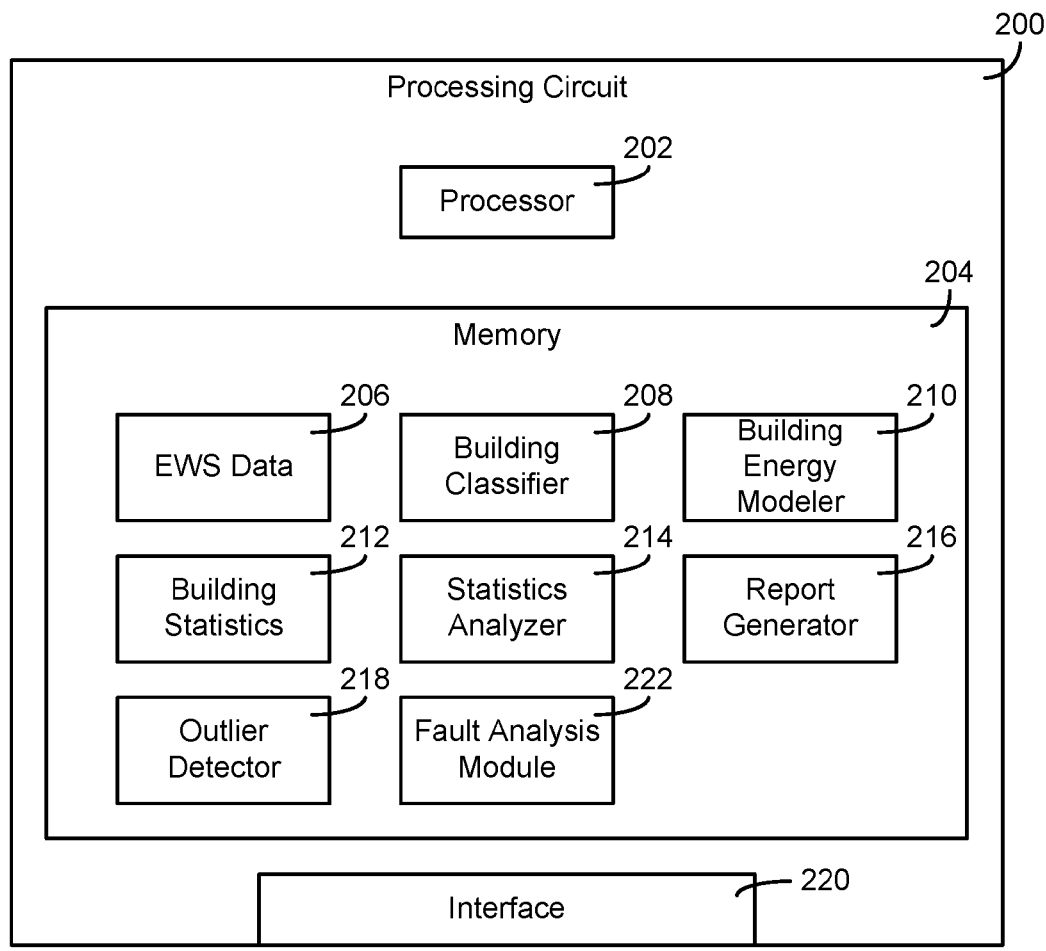
FIG. 2 is a block diagram of a processing circuit configured to analyze energy-related statistics of a building, according to an exemplary embodiment.

Referring now to FIG. 2, a block diagram of a processing circuit 200 configured to analyze energy-related statistics of a building is shown, according to an exemplary embodiment. In various embodiments, processing circuit 200 may be a component of a data acquisition and analysis service (e.g., data acquisition and analysis service 110 in FIG. 1) or any other computing device configured to analyze energy-related characteristics and statistics of a building.

Processing circuit 200 includes processor 202 and memory 204. Processor 202 may be or include one or more microprocessors (e.g., CPUs, GPUs, etc.), an application specific integrated circuit (ASIC), a circuit containing one or more processing components, a group of distributed processing components (e.g., processing components in communication via a data network or bus), circuitry for supporting a microprocessor, or other hardware configured for processing data. Processor 202 is also configured to execute computer code stored in memory 204 to complete and facilitate the activities described herein. Memory 204 can be any volatile or non-volatile computer-readable storage medium, or combinations of storage media, capable of storing data or computer code relating to the activities described herein. For example, memory 204 is shown to include computer code modules such as a building classifier 208, a building energy modeler 210, a statistics analyzer 214, a report generator 216, and an outlier detector 218. When executed by processor 202, processing circuit 200 is configured to complete the activities described herein.

Processing circuit 200 also includes a hardware interface 220 for supporting the execution of the computer code building classifier 208, building energy modeler 210, statistics analyzer 214, report generator 216, and outlier detector 218. Interface 220 may include hardware configured to receive data as input to processing circuit 200 and/or communicate data as output to another computing device. For example, processing circuit 200 may receive EWS data 206 from one or more sensors, databases, or remote computing devices. Interface 220 may include circuitry to communicate data via any number of types of networks or other data communication channels. For example, interface 220 may include circuitry to receive and transmit data via a wireless network or via a wired network connection. In another example, interface 220 may include circuitry configured to receive or transmit data via a communications bus with other electronic devices.

Memory 204 may include EWS data 206. In general, EWS data 206 may include any data relating to the characteristics of one or more buildings. In some embodiments, EWS data 206 may include sensor data generated by sensors associated with one or more buildings. Sensor data may include, but is not limited to, data regarding the energy use by the building (e.g., a measured demand, a measured consumption, etc.), a measured humidity or temperature internal or external to the building, security system data (e.g., a video feed, access logs, etc.), or a measured water use by the building. Associated with such data may also be a financial cost (e.g., an energy cost based on the building's energy usage).

EWS data 206 may include billing data from one or more utilities that supply the building. For example, EWS data 206 may include billing data from a utility that provides the building with electrical power. In another example, EWS data 206 may include billing data from a utility that supplies water to the building.

EWS data 206 may include data from a building's control system, such as set point data (e.g., temperature set points, energy use set points, etc.), control variables or parameters, and calculated metrics from the building's control system. In some cases, this data may be used by processing circuit 200 to determine or predict a building's energy use or to detect excessive consumption. For example, processing circuit 200 may determine that a building's HVAC system is consuming excessive energy.

EWS data 206 may include data regarding the physical characteristics of a building. For example, EWS data 206 may include data regarding the building's geographic location (e.g., street address, city, coordinates, etc.), dimensions (e.g., floor space, stories, etc.), use type (e.g., office space, hospital, school, etc.), or building materials. Similarly, EWS data 206 may include weather data for a building's geographic location, in some embodiments. For example, EWS data 206 may include weather data indicative of the climate where the building is located (e.g., the building is in a tropical climate, in a temperate climate, etc.). The weather data may be, or may include, TMY data, in various embodiments. The weather data may also include historical weather measurements from near-by the building's location. This may be obtained from either on-site sensors or an archived data from other nearby locations (e.g., airports, national weather stations, etc.).

Memory 204 may include building classifier 208. Building classifier 208 may be configured to categorize a building using EWS data 206 and to identify one or more similar buildings. In various embodiments, building classifier 208 may compare one or more characteristics of a building to that of one or more other buildings, to determine whether the buildings are similar. Characteristics compared by building classifier 208 may include, but are not limited to, the climates where the buildings are located, the usage types of the buildings, or the dimensions of the buildings. For example, office buildings that are both located in tropical climates may be classified as being similar to one another by building classifier 208. In some cases, a building's climate may affect the building's systems (e.g., HVAC) and building codes, which may also influence the building's energy use. For example, a building in a tropical climate may include HVAC cooling systems and operate primarily to cool the building. Similarly, a building's usage type may also affect the building's energy use. For example, a data center may use more energy than a school, due to the extra power consumed by the data center's computing devices.

In one embodiment, building classifier 208 may classify buildings belonging to the same enterprise as being similar. In some cases, an enterprise may use the same building design or similar building design through the enterprise. For example, branches of a bank may have the same or similar building designs. In another example, franchise locations of a fast-food restaurant may have the same or similar building designs. Such a classification may be based solely on the respective buildings' layouts being the same or may be based on one or more additional factors. For example, only buildings of an enterprise that are located in the same climate may be classified as being similar by building classifier 208.

Memory 204 may include building energy modeler 210 configured to model the energy use of a building using one or more building characteristics in EWS data 206. Any form of model may be used by building energy modeler 210 to model a building's energy use. For example, building energy modeler 210 may use parametric models (linear regression, non-linear regression, etc.), nonparametric models (neural networks, kernel estimation, hierarchical Bayesian, etc.), or something in between, such as a Gaussian process model to model a building's energy use, according to according to various embodiments. In one embodiment, building energy modeler 210 models the energy use of a building using linear regression. In various implementations, building energy modeler 210 may model the energy use (E) of a building as follows:

$$E = \beta_0 + \beta_1 x_1 + \ldots + \beta_n x_n + \epsilon$$

where E is the dependent variable representing the energy use (e.g., measured in kilowatt-hours), $x_i$ is an independent variable, $\beta_i$ is an element of the lean energy model parameter vector, and e is an error factor (e.g., a noise factor). In other words, any number of independent variables may be used by building energy modeler 210 (e.g., weather data, occupancy data, etc.) within an energy use model to model a building's energy use.

Building energy modeler 210 may use any number of different estimation techniques to estimate the values of lean energy model parameter vectors ($\beta_i$) used in a parametric energy use model. In some embodiments, building energy modeler 210 may use a partial least squares regression (PLSR) method to determine the lean energy model parameter vectors. In further embodiments, building energy modeler 210 may use other methods, such as ridge regression (RR), principal component regression (PCR), weighted least squares regression (WLSR), or ordinary least squares regression (OLSR). Generally, a least squares estimation problem can be stated as follows: given a linear model $$Y = X\beta + \epsilon, \quad \epsilon \sim N(0, \sigma^2 I)$$

find the vector $\hat{\beta}$ that minimizes the sum of squared error RSS:

$$RSS = \|Y - X\hat{\beta}\|^2.$$

the above equations, Y is a vector that contains the individual n observations of the dependent variable and X is a n by p+1 matrix that contains a column of ones and the p predictor variables at which the observation of the dependent variable was made. $\epsilon$ is a normally distributed random vector with zero mean and uncorrelated elements. According to various exemplary embodiments, other methods than using PLSR may be used (e.g., weighted linear regression, regression through the origin, etc.)

The optimal value of $\hat{\beta}$ based on a least squares estimation has the solution:

$$\hat{\beta} = (X^T X)^{-1} X^T Y$$

where $\hat{\beta}$ is a normal random vector distributed as:

$$\hat{\beta} \sim N(\beta, \sigma^2 (X^T X)^{-1}).$$

The resulting sum of squared error divided by sigma squared is a chi-square distribution:

$$RSS/\sigma^2 \sim \chi^2_{n-(p+1)}.$$

The difference in coefficients is distributed as:

$$\Delta \beta = \hat{\beta}_1 - \hat{\beta}_2 \sim N(0, \sigma^2 [(X_1^T X_1)^{-1} + (X_2^T X_2)^{-1}]).$$

The quadratic form of a normally distributed random vector where the symmetric matrix defining the quadratic form is given by the inverse of the covariance matrix of the normal random vector is itself a chi-square distributed random variable with degrees of freedom equal to the length of $\Delta \beta$:

$$\frac{\Delta \beta^T [(X_1^T X_1)^{-1} + (X_2^T X_2)^{-1}]^{-1} \Delta \beta}{\sigma^2} \sim \chi^2_{p+1}.$$

Additionally, the sum of two independent chi-square distributions is itself a chi-square distribution with degrees of freedom equal to the sum of the degrees of freedom of the two original chi-square distributions. Thus, the sum of the two root sum squared errors divided by the original variance is chi-square distributed, as:

$$\frac{RSS_1 + RSS_2}{\sigma^2} \sim \chi^2_{n_1 + n_2 - 2(p+1)}.$$

$n_1$ and $n_2$ are the number of data points used to estimate the lean energy model parameters $\hat{\beta}_1$, $\hat{\beta}_2$.

Building energy modeler 210 may store lean energy model parameter estimates and other data associated with the energy use model as building statistics 212. For example, building statistics 212 may include the determined lean energy model parameters ($\beta_i$), energy use (E), and any associated error measurements, such as a calculated RSS or coefficient of variation of a root mean square deviation (CVRMSE) score. In some embodiments, building energy modeler 210 may also use the model to generate other statistics regarding a building, such as an outdoor air flow rate, temperature set point, etc.

According to various embodiments, building energy modeler 210 may generate normalized statistics and store the generated statistics in building statistics 212. For example, energy use statistics may be normalized by building energy modeler 210 to account for changes in the weather at a building's location. In some embodiments, building energy modeler 210 may calculate normalized energy use of a building by driving the building's model using TMY data. A cooling or heating degree day value may also be used by building energy modeler 210. Generally, cooling degree days are calculated by integrating the positive difference between the time varying outdoor air temperature and the building's cooling breakeven temperature. Similarly, heating degree days are calculated by integrating the positive difference between the heating breakeven temperature and the time varying outdoor air temperature. Breakeven temperature corresponds to a single outdoor air temperature that coincides with the onset of the need for mechanical heating or cooling within the building. The integration interval is typically one month but other intervals may be used. For example, a cooling degree day (CDD) may be calculated as follows:

$$CDD = \int^{month} \text{Max}\{0, (T_{OA} - T_{BE})\} dt$$

where $T_{OA}$ is the outdoor air temperature of the building and $T_{BE}$ is the cooling breakeven temperature as previously defined. An alternative for calculating cooling or heating degree days is to assume a breakeven temperature (e.g. cooling breakeven temperature of 65° F.) regardless of the building characteristics. This approach is commonly used where breakeven temperatures are calculated based on geographical location (e.g. by city) in lieu of actual building characteristics. This approach is less accurate for building modeling but is common. Degree days may be used in the linear regression model by building energy modeler 210 as a dependent variable (e.g., as $x_1$). Degree days can also be used as statistics for benchmarking.

Understanding that the predicted consumption and lean energy model parameters obtained from building energy modeler 210 are actually normally distributed random variables with calculable mean and variance allows exemplary statistics that may be generated and stored in building statistics 212 to include mean and variance of: β and energy intensity values obtained by using billing data divided by area as the dependent value in building energy modeler 210 and the normalized annual consumption intensity ($I_{NAC}$) values obtained using the β intensity values driven by TMY data as the independent data input(s).

Memory 204 may include statistics analyzer 214 configured to analyze and compare statistics between two or more buildings. In some embodiments, statistics analyzer 214 may compare building statistics for buildings having the same or similar classifications, as determined by building classifier 208. For example, statistics analyzer 214 may compare one or more of a building's statistics in building statistics 212 to those buildings having the same climate and usage type (e.g., statistics for a data center located in a tropical climate may be compared to other data centers located in tropical climates).

Statistics analyzer 214 may perform univariate or multivariate statistical analysis on building statistics 212, according to various embodiments. In general, univariate statistical analysis refers to the analysis and comparison of a single type of statistic. Exemplary statistics that may be compared may include, but are not limited to, normalized annual consumption intensity ($I_{NAC}$) values for the buildings and intensities for β values (e.g., the lean energy model parameters) of the same type from the buildings' respective models (e.g., the intensities of the β values relating to weather data, the intensities of the β values relating to the bill data divided by area, etc.). Multivariate statistical analysis, in contrast, allows multiple parameters used in a building's model to be analyzed together. For example, statistics analyzer 214 may compare vectors of model parameters instead of singular model parameters, in some embodiments.

To compare normalized statistics for a class of buildings, the same TMY data for the class may be used by building energy modeler 210 to model the buildings in the class, according to some embodiments. In some embodiments, the mean and standard deviation of a particular type of statistic for buildings having the same classification may be determined by statistics analyzer 214. In other embodiments, statistics analyzer 214 may instead calculate robust estimators of the mean and standard deviation. For example, statistics analyzer 214 may determine a robust estimator of the mean when using multivariate statistical analysis on building statistics 212. Statistics analyzer 214 may use the calculated mean and standard deviations, or robust estimates thereof, to define a probability density function for a building statistic for a given class of buildings. Statistics analyzer 214 may also determine confidence intervals for the building statistic under analysis. In general, a confidence interval provides a range of values in which the true value of an estimate is likely to exist. For example, a 95% confidence interval may be a range of values where the true value is likely to be within the given range with a confidence of 95%.

Memory 204 may include outlier detector 218 configured to detect an outlier statistic among the statistics compared by statistics analyzer 214. In some embodiments, one or more statistics of a test building may be compared to the probability distribution of those statistics for the other buildings in the same class as the test building. For example, outlier detector 218 may determine that a building's statistic is an outlier for the class based on how many standard deviations the statistic is above or below the mean for the distribution. In some embodiments, outlier detector 218 may use a robust estimator of the mean and covariance from statistics analyzer 214 to detect an outlier. If univariate statistical analysis is used to compare building statistics, outlier detector 218 may use any number of outlier detection techniques to identify an outlier value. For example, outlier detector 218 may use a generalized extreme studentized deviate test (GESD), Grubb's test, or any other form of univariate outlier detection technique. In some cases outliers may be determined simply as the top or bottom fixed percentile of the building statistics (e.g., the lowest 5% of the buildings may be deemed outliers).

In some embodiments, outlier detector 218 may use a distance value between statistics, to detect an outlier. For example, outlier detector 218 may determine a Gaussian or Mahalanobis distance to compare statistics. Such a distance may represent a statistical distance away from the typical building in the class. If the Mahalanobis distance for a test building is above a critical value, outlier detector 218 may generate an indication that the building's one or more statistics are outliers in relation to the other buildings in the class. In some embodiments, outlier detector 218 may project the distance onto the vector directions defining changes in building energy use model parameters to determine the root cause. Other outlier detection techniques that may be used by outlier detector 218 include, but are not limited to, Wilkes' method (e.g., if multivariate analysis is used) and various cluster analysis techniques.

Outlier detector 218 may be configured to detect excessive consumption by a building. In some embodiments, outlier detector 218 may perform one or more null hypothesis tests using building statistics 212 and a building energy use model generated by building energy modeler 210. In general, hypothesis testing allows for the detection of an observed value that is statistically significant (e.g., the result is not a function of random chance). Exemplary hypothesis tests include F-tests and chi-squared tests. In some embodiments, hypothesis testing may be used to test one or more values against a baseline, as described in U.S. patent application Ser. No. 13/252,092 entitled "Systems and Methods for Detecting Changes in Energy Usage In a Building" and filed on Oct. 3, 2011, the entirety of which is hereby incorporated by reference.

Memory 204 may include a fault analysis module 222 configured to determine the effects of a fault on a building's energy consumption, according to various embodiments. In various embodiments, fault analysis module 222 may determine the changes in building energy use model parameters in building energy modeler 210 that result when a particular fault is present. For example, fault analysis module 222 may determine the set of changes in building energy use model parameters which are regression coefficients (e.g., Δβs) for the lean energy model that result from an air handling unit's (AHU) damper being stuck in the open position. In one embodiment, fault analysis module 222 may use a simulation model to determine the changes in the building energy use model parameters. In another embodiment, fault analysis module 222 may determine a mapping between the changes in temperature based building energy use model parameters and the changes in heat transfer related parameters of the building (e.g., the building's cooling coefficient, heating coefficient, cooling balance point, etc.). Fault analysis module 222 may provide the changes in temperature based building energy use model parameters to building energy modeler 210, which determines a corresponding change in the energy consumption of the building. For example, a stuck damper of an AHU may cause a building's normalized annual energy consumption to increase by 25,000 kWh/year. Fault analysis module 222 may also use this change in energy consumption to calculate a corresponding financial cost associated with the fault condition. For example, fault analysis module 222 may multiply the determined change in energy consumption by a blended utility rate to calculate a financial cost associated with the fault.

In some embodiments, fault analysis module 222 may also be configured to perform fault detection and analysis of the building under study using its energy use model generated by building energy modeler 210. In one embodiment, fault analysis module 222 may monitor (e.g., detect) the changes in the building energy use model parameters over time to detect potential faults. In another embodiment, fault analysis module 222 may perform fault detection using peer analysis with other buildings in its class to detect potential faults. For example, buildings having the outlier changes in building energy use model parameters (e.g., as determined by outlier detector 218) may be identified as having potential faults. If a potential fault is detected, fault analysis module 222 may use a mapping between the changes in temperature based building energy use model parameters (or TEM parameters) and changes in building heat transfer related parameters to determine the cause of the fault.

Memory 204 may include report generator 216 configured to generate a report using data from statistics analyzer 214, outlier detector 218, and/or fault analysis module 222. A report generated by report generator 216 may be, but is not limited to, graphs (e.g., bar graphs, box and whisker graphs, etc.), tables, textual reports, and other forms of graphical representations of the compared statistics for a test building and those of other buildings in the same class. For example, report generator 216 may generate a graph of a probability distribution of a statistic for the class of buildings that includes an indication of where the test building's statistic falls within the distribution. A report generated by report generator 216 may include an indication of a detected outlier statistic from outlier detector 218. In further embodiments, a report generated by report generator 216 may include an indication of a change in a building's energy consumption or its financial impact determined by fault analysis module 222.

Report generator 216 may provide a generated report to an electronic display directly or indirectly via interface 220. For example, report generator 216 may provide a generated report directly to an electronic display connected to interface 220. In another example, report generator 216 may provide a generated report to a remote device for display on the device's display (e.g., the report may be provided to a remote device connected to processing circuit 200 via a network). In a further example, report generator 216 may provide a generated report to a printer via interface 220.

In some cases, a report generated by report generator 216 may be used to set realistic priorities and goals when implementing energy conservation measures (ECMs) (e.g., by upgrading a building's HVAC equipment to more energy-efficient equipment). For example, assume that a report generated by report generator 216 indicates that a building's energy use is in the ninety-ninth percentile among buildings in its class. In such a case, the mean statistic for the class' probability distribution may provide an estimate for the expected improvement to the test building's energy use, should ECMs be implemented.

In further cases, a report generated by report generator 216 may be used by an individual to identify potential faults. For example, a building that has already implemented ECMs and has an energy use that is statistically higher than a threshold value may be identified as possibly having a fault. In various embodiments, a report may generally identify a building as being a statistical outlier among its class (e.g., indicating that further analysis may be needed) or may even include diagnostic information that may be used by a technician to correct the abnormality (e.g., the report may indicate that a building's rate of heating or cooling is lower than other buildings in its class, etc.).

Univariate Analysis of Building Statistics

In various embodiments, a single statistic derived from a building's energy use model may be compared to those of other buildings in the building's class. For example, a value relating to the building's energy use may be compared statistically to those of other buildings in the same class (e.g., by comparing normalized annual consumption intensities, etc.). Similarly, other statistics generated by building energy modeler 210 may be compared to the corresponding value from other buildings in the same class (e.g., the intensity of $\beta_0$, $\beta_1$, etc.). Such a comparison may be used, for example, to determine whether the building is a good candidate for ECMs, to set realistic expectations when implementing ECMs, or to determine whether a potential fault exists in the building's equipment.

Figure 3:
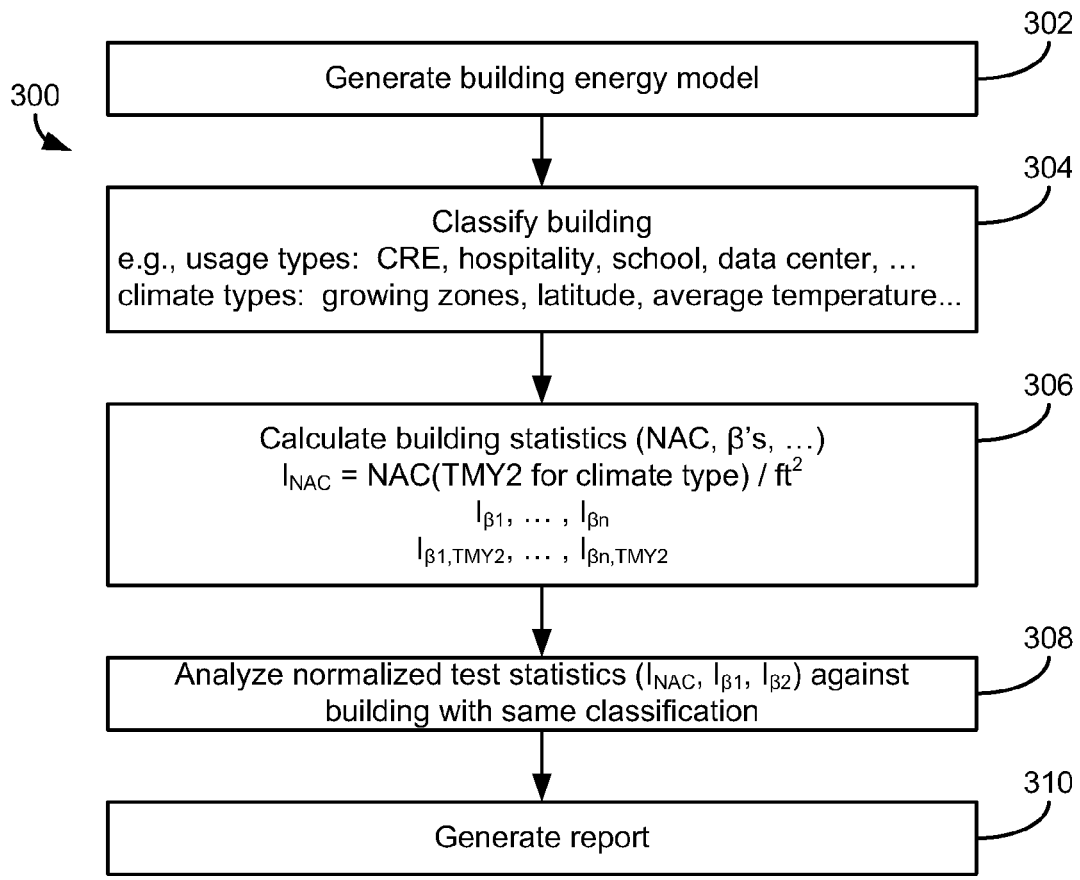
FIG. 3 is a flow chart of a process for analyzing energy-related statistics of a building, according to one embodiment.

Referring now to FIG. 3, a flow chart of a process 300 for analyzing energy-related statistics of a building is shown, according to one embodiment. Process 300 may be implemented by one or more computing devices, such as by a data acquisition and analysis service, by a building's control system, or the like. Generally, process 300 allows for a value derived from a building's energy use model to be compared to those of similar buildings.

Process 300 includes generating a building energy use model for a building (step 302). In various embodiments, the building energy use model may be a regression model (e.g., a lean energy use model) that uses a value relating to the building's energy use as the dependent variable. Any number of independent variables that may affect the building's energy use (e.g., weather data for the building's location, the building's occupancy, etc.) may be used in the model. In a simple example using only weather data as an independent variable, a building's energy use may be modeled as follows:

$$E = \beta_0(\#days) + \beta_1(CDD) + \ldots + \epsilon_1$$

where E is the dependent variable representing the building's energy use, CDD is a cooling degree day value for the building, $\beta_0$ is a first energy use model parameter, $\beta_1$ is a second energy use model parameter corresponding to the weather-related input, and $\epsilon_1$ is an error factor (e.g., a noise factor). For example, actual outdoor air temperature measurements for the building may be used to determine the building's CDD or HDD data. In general, the optimal value of $\hat{\beta}$ for the model based on a least squares estimation has the solution:

$$\hat{\beta} = (X^T X)^{-1} X^T Y$$

where X represents the actual weather data for the building and Y represents the billing data for the building. In one embodiment, billing data used as the independent variable, E, may be divided by the building's area (e.g., to determine an energy use per unit of floor area, such as ft$^2$).

Process 300 may include classifying the building and one or more other buildings (step 304), in some embodiments. Any number of combinations of a building's characteristics may be used to classify the building. In some embodiments, buildings may be classified by usage type. For example, a building may be classified as a commercial real estate (CRE) building (e.g., office building), a hospitality building (e.g., a hotel), a school, a data center, etc. A building's usage type may indicate the types of equipment in the building that may affect the building's energy use. For example, a data center may have a higher energy use than a school, due to the energy demands of the servers in the data center.

In some embodiments, a building may be classified by the climate where the building is located. In one embodiment, location data for the building may be used to determine the climate for the building's location. For example, location data for a building may include the building's zip code, area code, street address, latitude, longitude, city, state, country, building codes, or any other form of location data. In general, a building's climate may affect the building's HVAC configuration (e.g., the equipment of a building in a tropical climate may primarily operate to cool the internal temperature of the building). A building's climate may also affect the energy use by the building's HVAC equipment, due to weather fluctuations (e.g., by affecting the amount of heating or cooling needed to maintain an internal temperature set point relative to the outdoor temperature).

Historical weather data may be associated with a building's climate or location. In some cases, the historical weather data may be recorded directly by the building's equipment (e.g., a measured outdoor air temperature, a measured outdoor humidity, etc.). In other cases, the historical weather data may be weather data measured over the course of decades. For example, a single set of representative TMY data could be used to determine normalized annual consumption (NAC) intensity statistics for the building and the other buildings with the same classification. Such a value may be determined, for example, using the least squares estimation corresponding to:

$$\hat{I}_{NAC} = \hat{\beta}^T X_{TMY}$$

$$X_{TMY} = \begin{bmatrix} \eta_{days/yr} \\ CDD_{TMY,yr} \\ HDD_{TMY,yr} \end{bmatrix}$$

where $CDD_{TMY}$ and $HDD_{TMY}$ are cooling and heating degree days calculated using TMY data and $\beta$ is determined from building energy modeler 210 where the independent variable data is normalized by floor area and is time synchronized with the dependent variable data.

Process 300 includes calculating building statistics for the buildings under analysis (step 306). The buildings under analysis may include a plurality of buildings belonging to the same class, in one embodiment. For example, building statistics for a school located in a moderate climate and one or more other schools located in the same climate may be calculated. In some embodiments, the statistics may be normalized, allowing a direct comparison of the statistics to be made between a test building and other buildings in the same class.

In various embodiments, the building energy use model may be a regression model (e.g., a lean energy model) that can be solved to determine a building's statistics. For example, a parameter estimation technique (e.g., PLSR, OLSR, RR, etc.) may be used to estimate the $\beta_i$ parameters in the building energy use model. Calculations may also be made to evaluate the reliability of the model and/or to detect abnormal values that depart from the model (e.g., statistics regarding the model itself). For example, a coefficient of determination, t-statistic, f-statistic, or other evaluative measurement may also be calculated with the building energy use model. Other forms of the building energy use model may also be used (e.g., a non-linear model, etc.) and their resulting values used to derive the building statistics.

In general, building statistics may correspond to any value derived from the building energy use model. For example, a building statistic may be a normalized annual consumption intensity ($I_{NAC}$) value or an intensity value for one of the model's $\beta_i$ parameters, if a regression model is used to model the building's energy use. Further exemplary building statistics that may be derived from the building energy use model may include, but are not limited to, the building's thermal efficiency ($\eta$), the building's thermal conductance area product (UA), temperature set point ($T_{setpt}$), outdoor air flow ($Flow_{OA}$), or other such values.

Process 300 includes analyzing one or more of the normalized test statistics for the buildings under study and for the buildings having the same classification (step 308). In some embodiments, a probability density function may be generated for the buildings having a particular classification. For example, a probability density function may be generated for data centers located in tropical climates using their normalized annual consumption intensities. A comparison may be made between such a probability density function and the statistic for the building under study. For example, the building's statistic may be compared to the probability distribution function to determine the difference in standard deviations between the mean and the building statistic.

The analysis of the building statistics may include detecting an outlier. In some embodiments, the difference between the statistic for the building under study and those of the buildings in the class may be compared to a threshold value. For example, if the difference between the statistic for the building and the mean for the buildings in the class is greater than a threshold value, the building's statistic may be identified as being an outlier. Other techniques to identify a statistical outlier may also be used. In various embodiments, a geometric approach may be used (e.g., the distance between a statistic and its k-nearest neighbors may be evaluated to detect an outlier) or other statistical approaches may be used (e.g., Peirce's criterion, the GESD method, Chauvenet's criterion, etc.).

Process 300 further includes generating a report based on the analyzed statistics (step 310). The generated report may include data regarding a comparison of the statistic for a building and the statistics for one or more other buildings in its class. For example, a generated report may include a graph of a probability distribution function of a statistic for a class of buildings (e.g., hotels located in temperate climates) and an indication of how the statistic for a particular building compares to the class. The generated report may also include data regarding any detected outlier statistics. For example, the report may include only an indication that a building's statistic is an outlier compared to its class or may include diagnostic information regarding possible causes of the statistic.

Figure 4A:
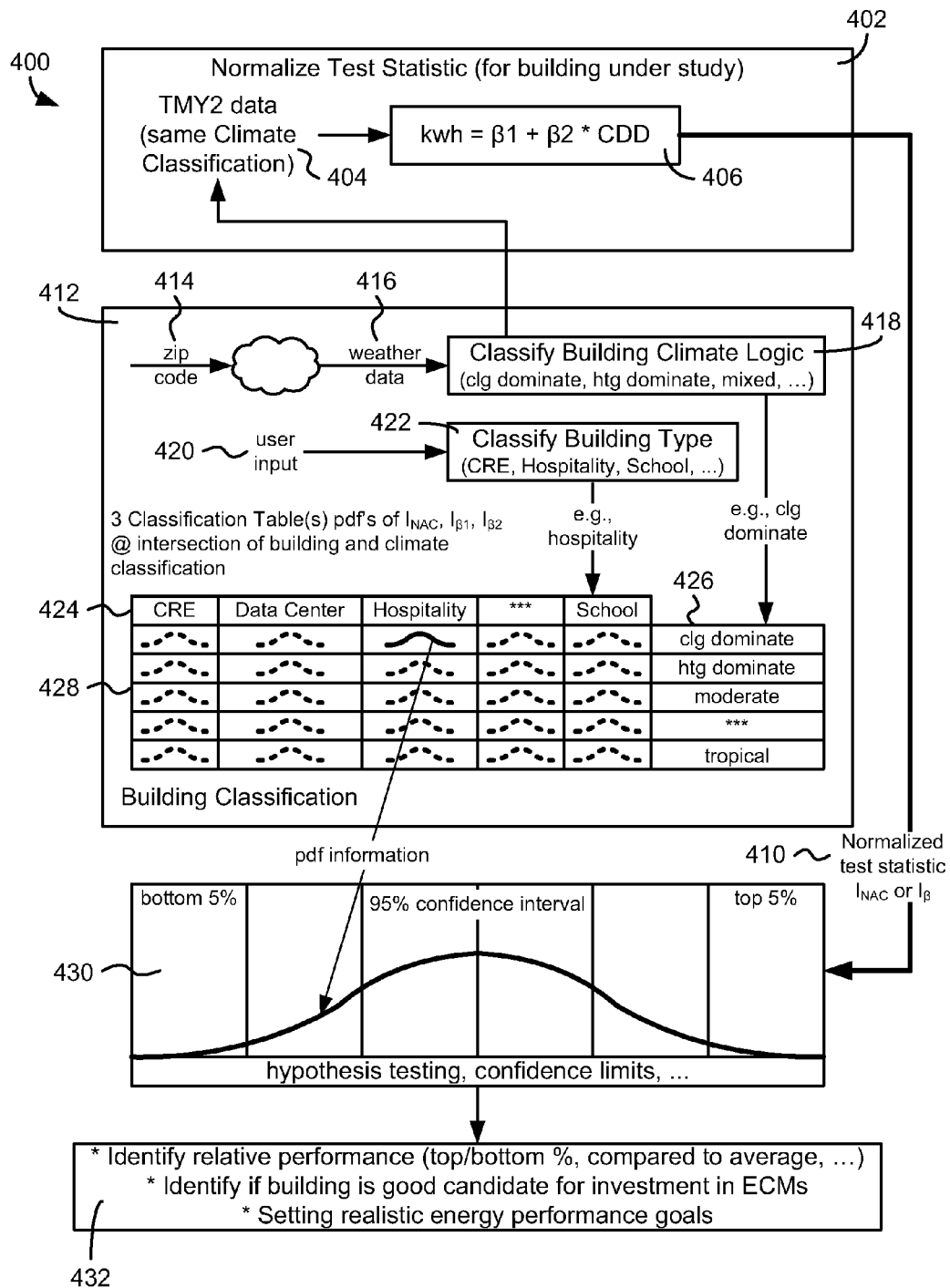
FIG. 4A is an illustration of an energy-related building statistic being compared with the statistics of other buildings, according to one embodiment.

Referring now to FIG. 4A, an illustration 400 of an energy-related building statistic being compared with the statistics of other buildings is shown, according to one embodiment. In the example shown, a building may be classified (block 412), its normalized energy use intensity modeled (block 402), and a statistic related to the building's energy use may be compared to those of other buildings having the same classification (block 432). In some embodiments, univariate statistical analysis may be used to evaluate the statistic for the building under study and the statistics for the other buildings having the same classification.

Buildings may be classified using any number of characteristics (by their usage type, climate, age, installed equipment, etc.), according to one embodiment. For example, buildings may be classified by their respective climates (block 418). In some cases, a building's climate may be determined based on the building's geographic location. For example, a building's zip code 414 may be used to determine the climate classification and to retrieve the TMY data for that climate as needed to drive the model 406. Other exemplary geographic inputs include a building's city, area code, or coordinates.

Based on weather data 416, the building's climate may be determined and used to associate the building with one of climate classifications 426. In general, a building's climate affects the operational mode and control logic for the building's HVAC system. For example, a building located in a hot climate may have an HVAC system that primarily operates in a cooling dominate manner. The cooling or heating requirements of the building may also affect the building's energy use (e.g., a building requiring more heating may use more energy). In some cases, the cooling or heating requirements of a building may be quantified using an HDD or CDD value, which may be included in weather data 416 or derived at block 418. Exemplary climate classifications may include, but are not limited to, cooling dominate climates, heating dominate climates, mixed climates (e.g., climates that require both heating and cooling at different times of the day, month, or year), moderate climates (e.g., climates in which building may not require much heating or cooling), tropical climates, and the like.

A building may also be classified by its usage type (block 422). Input data 420 from a user (e.g., data received via a user interface device) may be used to associate the building with one of usage type classifications 424. In some cases, input data 420 may simply include a selection of one of usage type classifications 424. In other cases, input data 420 may include answers to questions regarding the building. For example, a survey may be provided to an electronic display that includes questions regarding the building (e.g., they types of businesses that are located in the building, the type of equipment in the building, etc.). Based on the received answers to the questions, a matching usage type in usage type classifications 424 may be selected and associated with the building. Exemplary usage type classifications 424 include CRE buildings, data centers, hospitality centers, schools, etc.

The building energy use model under study may be modeled and analyzed using the building's characteristics. For example, the billing data, actual weather data, and area data for the building may be used to generate an energy use model for the building. Billing data may include data indicative of energy consumption (e.g., measured in kWh), energy demand, water consumption, or one or more associated costs. In some cases, the billing data may be divided by the building's area in the building energy use model. For example, the dependent variable in the building energy use model may correspond to one or more measured energy consumptions per square foot of the building.

Building energy use models may be generated for the other buildings in the same class as the building under study, in a similar manner as the building under study. For example, billing data and actual weather data for the buildings may be used within regression models to model the buildings' energy consumptions. The resulting $\beta_i$ parameters from these models may be used, in some embodiments, to compare the buildings. For example, an intensity value for a $\beta_i$ parameter for a building may be used as a compared value 410 to compare the building's statistic to other buildings in its class.

Normalized statistics for the building under study may also be determined (block 402) and compared between buildings in a class. For example, TMY2 data 404 may be selected based on the building's classification (e.g., the building's location may be used to determine the corresponding TMY2 data). In such a case, the TMY2 data 404 may be used to drive energy use model 406, to determine an NAC value for the building. For example, a normalized annual consumption intensity ($I_{NAC}$) value may be determined from the modeled independent variable of energy use model 406. Other statistics may also be normalized for the building under study across all buildings in its class. For example, the building's calculated thermal efficiency (n), thermal conductance area product (UA), temperature set point ($T_{setpt}$), outdoor air flow ($Flow_{OA}$), or any other statistic may be normalized and compared to those of other buildings in its class.

Similar to the building under study, normalized statistics also may be derived from the energy use models for each building belonging to a particular class. For example, normalized intensity values (e.g., $I_{NAC}$, $I_{\beta 1}$, $I_{\beta 2}$, etc.) may be determined using the respective buildings' energy use models. In the example shown, the resulting statistics for a class of buildings may be used to generate probability distribution functions 428 for each of the statistics. Probability distribution functions 428 may include, for example, a probability distribution function for the normalized annual consumption intensities of the hospitality buildings located in cooling dominate climates. Various metrics associated with probability distribution functions 428 may also be calculated, such as a distribution's mean, median, mode, or standard deviation.

In one embodiment, further statistical analysis may be used to evaluate probability distribution functions 428. The underlying data may include population data or sampled data from a population. Population data may come from situations where a customer has data from all similar buildings in a portfolio (e.g. bank branch offices). Sample data may come from situations where it is either impractical or impossible to get data for all members of a population (e.g. commercial office buildings in a moderate climate). For population data from a near normal distribution; the calculated population mean ($\mu$) and standard deviation ($\sigma$) can be used to calculate $100(1-\alpha)\%$ confidence intervals for the statistic X as follows:

$$\mu - z_{\alpha/2} \cdot \sigma < X < \mu + z_{\alpha/2} \cdot \sigma$$

In another embodiment, less than the full population may be used by finding the values such that a fraction of $\alpha/2$ is less than the threshold and a fraction of $\alpha/2$ is greater than the threshold. For near normal sample data, point and interval estimates can be used to infer information about the population statistics. Point estimates use sample data to derive a single number that is the most plausible value of a population statistic. For example, point estimates for the population mean and standard deviation obtained from the sample mean $\overline{X}$ and standard deviation S are:

$$\hat{\mu} = \overline{X} \text{ and } \hat{\sigma} = S$$

The sampling distributions of $\overline{X}$ and S can be used to understand the margin of error in the point estimates. A $100(1-\alpha)\%$ confidence interval on the population mean $\mu$ can be calculated from the sampling distribution of the sample mean:

$$\overline{X} - t_{\alpha/2, n-1} \cdot \frac{S}{\sqrt{n}} < \mu < \overline{X} + t_{\alpha/2, n-1'} \cdot \frac{S}{\sqrt{n}}$$

Where n equals the number data points in the sample. Likewise a $100(1-\alpha)\%$ confidence interval on the population variance ($\sigma^2$) can be calculated from the sampling distribution of the sample variance $S^2$ as follows:

$$\frac{(n-1)S^2}{\chi^2_{\alpha/2, n-1}} < \sigma^2 < \frac{(n-1)S^2}{\chi^2_{1-\alpha/2, n-1}}$$

Where $\chi^2$ is a chi squared distribution.

In some embodiments, hypothesis testing may be performed to make a statement about population parameters from sample data for buildings in a particular class. Generally, a hypothesis test may test the validity of a hypothesis regarding a set of data. For example, a hypothesis test may be used to evaluate how well a regression model fits the energy use data for the buildings. In some cases, a null hypothesis test may be used which attempt to prove that a hypothesis is wrong given a set of data. Exemplary hypothesis tests may include, but are not limited to, F-tests, t-tests, and chi-squared tests. In one example, a hypothesis test may be used to test the hypothesis that a building statistic (x) comes from the distribution of the same building statistic for a given classification. In such a case we reject the null hypothesis and declare the building's statistic an outlier if either of the following holds true:

$$tinv\left(\frac{(1-\alpha)}{2}, n-1\right) < t \text{ or } t < tinv\left(\frac{\alpha}{2}, n-1\right)$$

where t is the test statistic (t=x/s). A null hypothesis ($H_0$) may be tested against an alternate hypothesis ($H_a$). Hypothesis testing generally results in one of two outcomes: rejection of the null hypothesis or failure to reject the null hypothesis. Since failure to reject the null hypothesis does not mean that the null hypothesis is true, the null hypothesis should be selected such that rejection of the null hypothesis is meaningful. For example, assume that the null hypothesis is that the financial savings that result from implementing an ECM is greater than or equal to a predicted savings and that the alternate hypothesis is that the savings is less than the predicted amount. If the null hypothesis in this case is rejected, the savings are not greater than or equal to the predicted amount.

One of normalized statistics 410 may be compared to the corresponding statistics from the other buildings in its class (block 430). For example, the normalized annual consumption intensity ($I_{NAC}$) of the building under study may be compared to those of other buildings in its class. The comparison in block 430 may include comparing the statistic to a probability distribution function for the class' statistics. For example, the comparison may include determining how many standard deviations the building's statistic is above or below the mean of the probability distribution function for the other buildings in the same class. The comparison may also include determining whether the statistic for the building under study is above or below a threshold value relative to the probability distribution function. For example, a statistic that is above or below a threshold number of standard deviations above or below the mean may be identified as requiring further attention. In some embodiments, outliers may be detected (e.g., using the GESD method, hypothesis testing, Wilks' method, cluster analysis, etc.). For example, the GESD or Wilks' method may be performed iteratively to remove outliers before comparing buildings' statistics.

Various reports may be generated based on the comparison between the statistics for the building under study and those in the probability distribution function (block 432). In one embodiment, a generated report may identify the building's relative performance based on the comparison (e.g., by identifying the building as being in the top or bottom x %, identifying the difference between the statistic and the median, etc.). In another embodiment, a generated report may identify whether the building under study is a good candidate for ECMs. For example, a report may identify a building as being a good candidate if the building's normalized annual consumption intensity is above a certain threshold value above the mean of the probability distribution for its class. Similarly, a generated report may indicate that a fault may exist in the building. For example, a building in which ECMs were implemented and has a higher than average statistic may be flagged for further diagnosis. A generated report may also be used to set realistic performance goals for ECMs, based on the performance of other buildings in its class in which the ECMs were implemented.

Referring now to FIGS. 4B-4E, a more detailed example of an energy-related building statistic being compared with the statistics of other buildings is shown, according to an exemplary embodiment. FIGS. 4B-4E generally illustrate the use of lean energy analysis to compare buildings having the same classification. Based on readily available data, such as billing data, weather data for the buildings' locations, etc., building energy use models may be determined and used to compare buildings within a given classification.

Figure 4B:
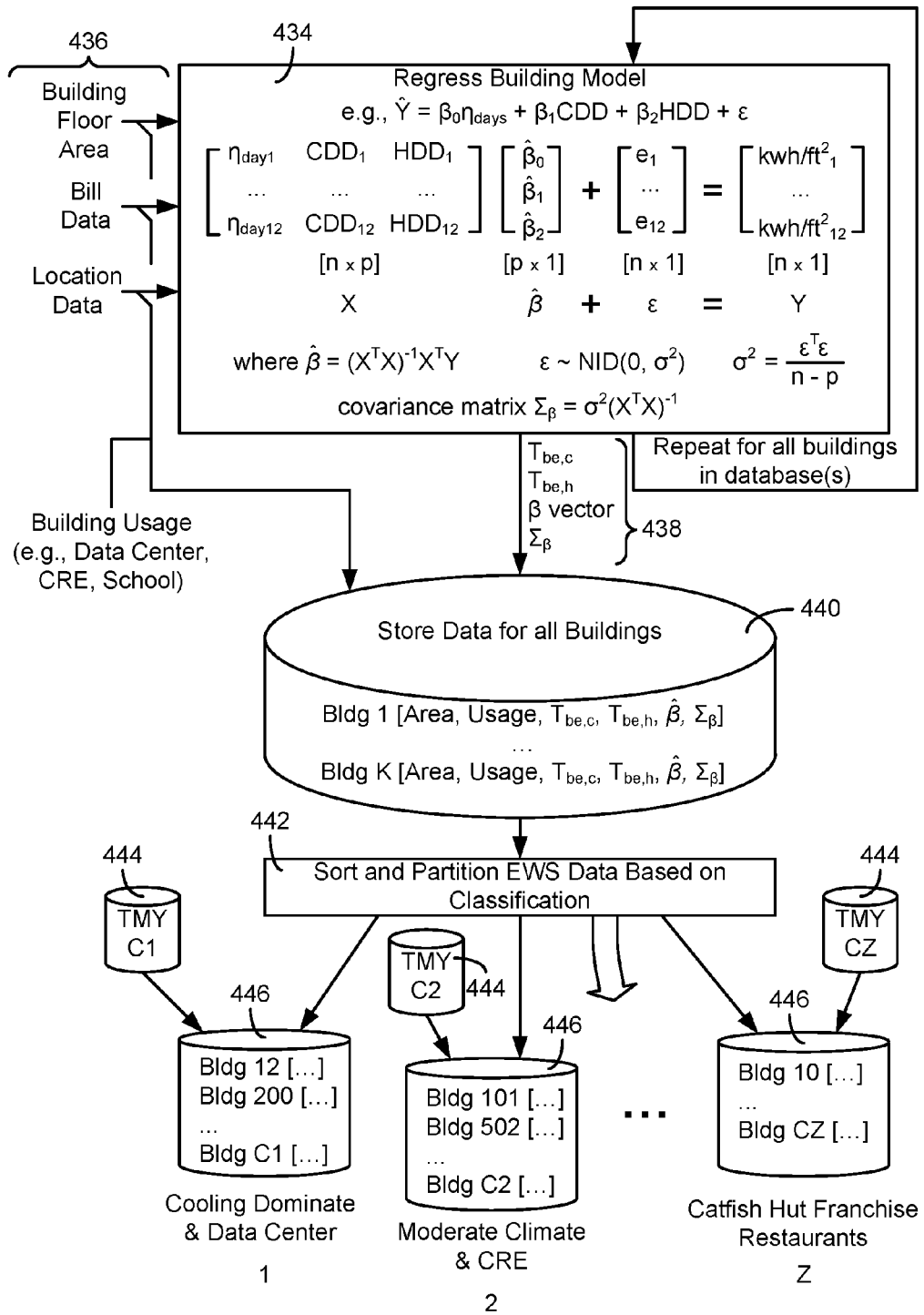
FIGS. 4B-4E illustrate an energy-related building statistic being compared with the statistics of other buildings in more detail, according to an exemplary embodiment.

In FIG. 4B, data 436 may be received regarding a plurality of buildings. In one embodiment, data 436 may include data regarding the floor area of a building, billing data for the building (e.g., data from an electric utility, from a water utility, etc., regarding the building's consumption of a resource, a cost of the consumption, etc.), location data for the building, or data regarding the building's usage type (e.g., whether the building is a data center, CRE, school, etc.). Data 436 may be obtained from readily available sources in accordance with lean energy analysis, allowing the energy use of the respective buildings to be modeled using minimal data (e.g., without incurring the financial cost of conducting an expensive energy audit).

In block 434, a regression model may be generated for each building using the building's corresponding data in data 436 (i.e., block 434 may be repeated for some or all of the buildings for which data 436 is known). For example, each building may be modeled as follows:

$$E = \beta_0(\#days) + \beta_1(CDD) + (HDD) + \epsilon$$

where E is the dependent variable representing the building's energy use, CDD is a cooling degree day value for the building, HDD is a heating degree day value for the building, e is an error factor, and $\beta_0$-$\beta_2$ are lean energy model parameters which are also coefficients for the model. Values for the dependent variables in the regression model may be obtained over any number of different time periods and used to form a matrix of independent variables. For example, an n×p matrix X may be formed using the independent variables (e.g., lean energy model parameters) for the building (e.g., #days, CDD, HDD values, person days, etc.). Values in matrix X may correspond to values calculated over a sliding time frame throughout the course of the year (e.g., the first row of matrix X may contain values obtained using data from September 2012-September 2013, the second row of matrix X may contain values obtained using data from October 2012-October 2013, etc.). A p×1 vector $\hat{\beta}$ (e.g., containing $\beta_0$, $\beta_1$, $\beta_2$, etc.) and an n×1 vector $\epsilon$ (e.g., containing $\epsilon$ values) may likewise be formed. Finally, the independent variables representing n number of normalized energy consumptions (e.g., energy consumption values divided by the building's floor area) may be used to form an n×1 vector Y. In other words, the regression model may be represented in the form:

$$X\hat{\beta}+r=\hat{Y}$$

where X is a matrix containing the independent variables, $\hat{\beta}$ is a vector containing the lean energy model parameters, r is the vector containing the residuals, and $\hat{Y}$ is a vector of estimated energy consumption values normalized by building floor area. The estimated variance of the model error is given by:

$$\hat{\sigma}^2 = \frac{r^T r}{n-p}$$

and a covariance matrix $\hat{\Sigma}_\beta$ equal to:

$$\hat{\Sigma}_\beta = \hat{\sigma}^2 (X^T X)^{-1}$$

In various embodiments, any number of different regression techniques (e.g., OLSR, WLSR, etc.) may be used to solve for the vector $\hat{\beta}$ containing the regression lean energy model parameters. For example, a least squares regression has the following solution for the lean energy model parameters:

$$\hat{\beta}=(X^T X)^{-1} X^T Y$$

where $X^T$ is the transpose of the matrix X.

At block 440, the variables 438 for each building obtained from their respective regression models may be stored in an electronic memory. For example, a building's cooling break even temperature ($T_{b,C}$), heating break even temperature ($T_{b,H}$), building energy use model parameters (e.g., the parameter values in vector $\hat{\beta}$), and the covariance matrix $\Sigma_\beta$ may be stored for each building. A building's cooling break even temperature ($T_{b,C}$) and heating break even temperature ($T_{b,H}$) may be referred to as temperature based energy model (TEM) parameters. Data 436 may also be stored in the memory for each building. For example, a building's floor area, billing data, location data, or usage type may be stored in the memory with the values from the building's regression model.

At block 442, the data stored for each building in block 440 may be sorted and partitioned based on the buildings' classifications. For example, the buildings may be classified and grouped based on their location, usage type, or any other characteristic. Any number of different groups of buildings may result depending on the type of classification used (e.g., a first through $z^{th}$ group of buildings). As shown, building groups 446 may include a first group of data centers located in a cooling dominate climate, a second group of CRE located in a moderate climate, and a group of franchise restaurants (e.g., "Catfish Hut" restaurants). A set of TMY data 444 may also be associated with each of building groups 446. For example, TMY data for a cooling dominate climate may be associated with the first group of buildings, TMY data for a moderate climate may be associated with the second group of buildings, etc.

Figure 4C:
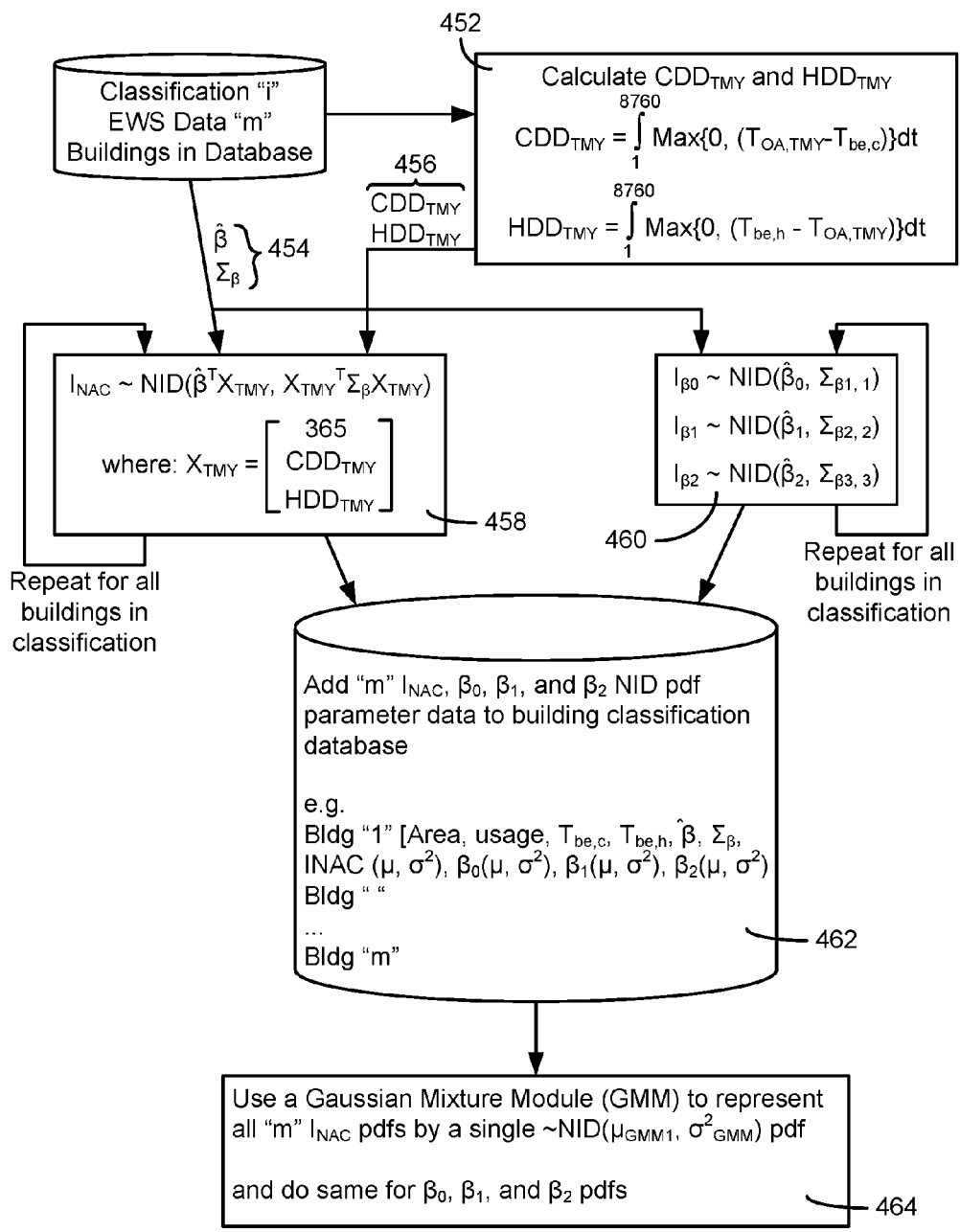

Continuing the example of lean energy analysis in FIG. 4C, normalized intensity values (e.g., normalized annual consumption intensity values ($I_{NAC}$), etc.) may be determined for each of building groups 446 (e.g., for each building having a particular classification). In some embodiments, normalized intensity values are normalized annual consumption intensity values ($I_{NAC}$). In other contemplated embodiments, normalized intensity values are intensity values other than normalized annual consumption intensity values ($I_{NAC}$). The corresponding TMY data 444 for the building groups 446 may be used to drive the buildings' energy use models, to determine the normalized intensity values for the buildings. In general, these calculations allow for the buildings' energy consumptions to take into account the typical changes in the weather throughout the year.

In block 452, TMY data 444 may be used for each building in a particular class to determine CDD and HDD values 456 for the buildings. For example, a $CDD_{TMY}$ value may be determined as follows:

$$CDD_{TMY} = \int_0^{8760} \text{Max}\{0, T_{OA,TMY} - T_{be,c}\} dt$$

where $T_{OA,TMY}$ is the outdoor air temperature indicated by TMY data 444, $T_{be,c}$ is the cooling break even temperature for the building and 8760 represents the time period over which the CDD value is calculated (e.g., 24 hours*365 days=8760 hours). Similarly, an $HDD_{TMY}$ value may be determined as follows:

$$TDD_{TMY} = \int_0^{8760} \text{Max}\{0, T_{be,h} - T_{OA,TMY}\} dt$$

where $T_{be,h}$ is the heating break even temperature for the building, $T_{OA,TMY}$ is the outdoor air temperature indicated by TMY data 444, $T_{be,h}$ is the heating break even temperature for the building and 8760 represents the time period over which the CDD value is calculated (e.g., 24 hours*365 days=8760 hours).

For each building having a particular classification, the building's values 456 may be used with its stored values 454 (e.g., vector $\hat{\beta}$ and covariance matrix $\Sigma_\beta$) to determine the intensity values (e.g., normalized annual consumption intensity values ($I_{NAC}$), etc.) for the building. In block 458, a normalized annual consumption intensity value ($I_{NAC}$) may be determined for a building using the CDD and HDD values 456. For example, the NAC values in vector Y may be divided by the typical production values that result by driving the energy use model with the TMY-derived values 456. Intensity values for the building energy use model parameters in vector $\hat{\beta}$ may be determined in block 460 in a similar manner. The $I_{NAC}$ and $I_\beta$ values obtained for each building form probability density functions. All data obtained for a building via blocks 452, 458, and 460 then may be stored in the electronic memory, as shown in block 462 (e.g., the memory may store the obtained data for m-number of buildings having a particular classification).

In block 464, a Gaussian mixture model (GMM) may be used to represent all $I_{NAC}$ probability density functions for the buildings in a particular classification as a single probability density function. A GMM may also be used for each of the building energy use model parameter intensities (e.g., $I_{\beta0}$, $I_{\beta1}$, $I_{\beta2}$, etc.) to generate corresponding probability density functions to represent the buildings in the class. For example, the $I_{NAC}$ probability density functions for data centers located in a cooling dominate may be combined in block 464 to form a single probability density function to represent the entire class.

Figure 4D:
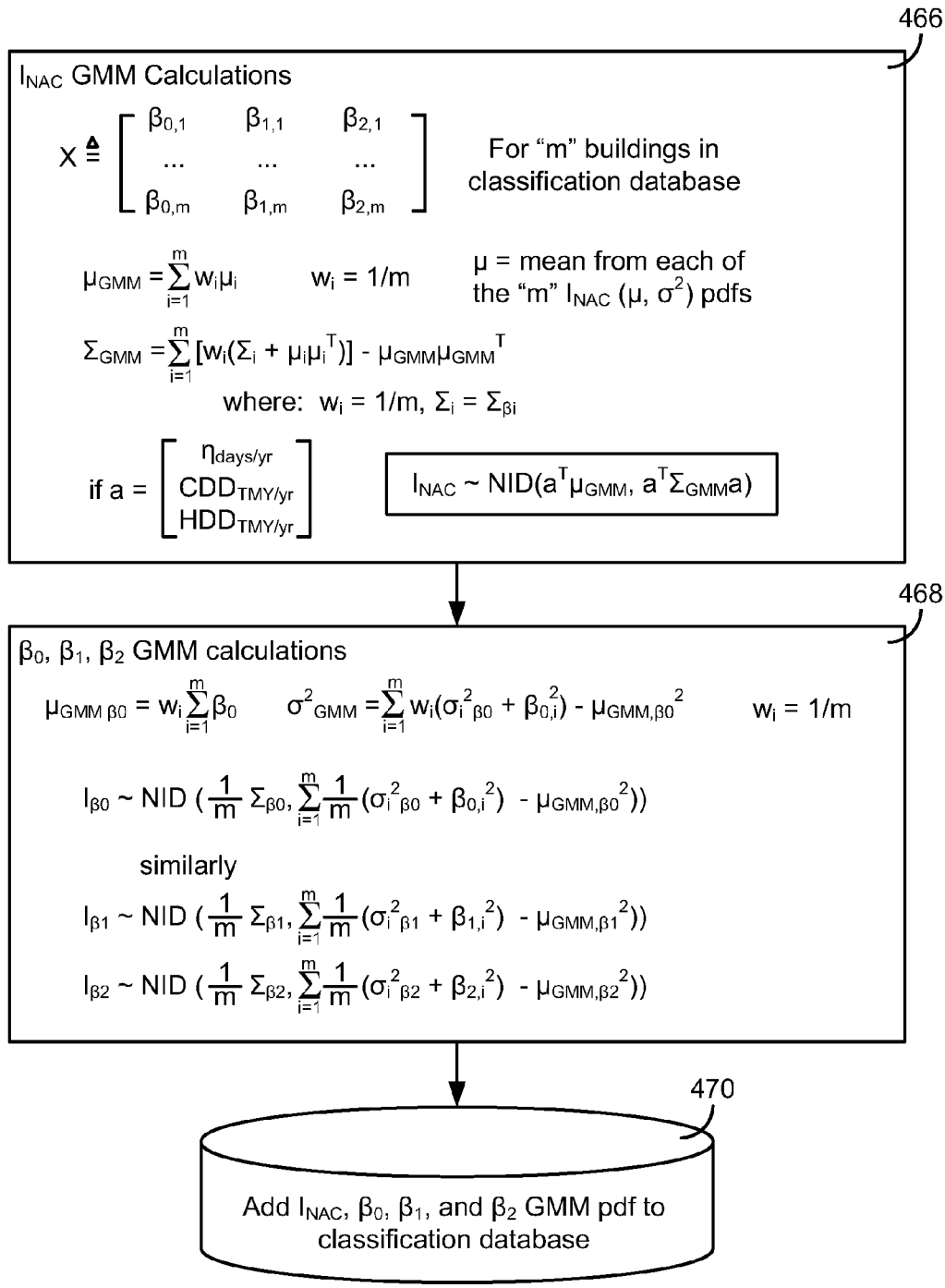

FIG. 4D shows the GMM calculations of block 464 in more detail. In block 466, the m-number of $I_{NAC}$ probability density functions for the buildings in a class may be combined into a single $I_{NAC}$ probability density function using a GMM. First, a mean of the individual probability density functions may be calculated as follows:

$$\mu_{GMM} = \sum_{i=1}^{m} w_i \mu_i$$

where $\mu_i$ is the mean of the $I_{NAC}$ probability density function for the ith building in the class and $w_i$ is equal to 1/m or the ratio of building i's area/total area, depending on the desired weighting. A covariance matrix may also be determined as follows:

$$\Sigma_{GMM} = \sum_{i=1}^{m} [w_i(\Sigma_i + \mu_i \mu_i^T)] - \mu_{GMM} \mu_{GMM}^T$$

where $w_i$ is equal to 1/m and $\Sigma_i$ is the covariance matrix for the $\beta_i$ coefficients for the ith building in the class (e.g., $\Sigma_{\beta i}$). The resulting probability distribution function may then be determined such that the $I_{NAC}$ for the buildings in the class are normally and independently distributed as follows:

$$I_{NAC} \sim NID(a^T \mu_{GMM}, a^R \Sigma_{GMM} a)$$

where a is a vector of the independent variables (e.g., # days, $CDD_{TMY}$, $HDD_{TMY}$, etc.) used to determine the normalized annual consumption intensity values.

In block 468, each of probability density functions for the building energy use model parameters (e.g., the $\beta_i$ values) for the buildings in a class may be combined using GMMs to form combined probability density functions. Where a multivariate approach may be used in block 466, a scalar approach may instead be used in block 468 for each of the building energy use model parameters. For example, the probability density functions for the building energy use model parameter $\beta_0$ may be determined by first calculating a mean of the $\beta_0$ for each of the buildings in the class as follows:

$$\mu_{GMM,\beta0} = w_i \sum_{i=1}^{m} \beta_0$$

where $\beta_0$ is the building energy use model parameter for the ith building in the class. A variance may also be determined as follows:

$$\sigma_{GMM}^2 = \sum_{i=1}^{m} w_i(\sigma_{i,\beta0}^2 + \beta_{0,i}^2) - \mu_{GMM,\beta0}^2$$

where $w_i$ is equal to 1/m (or the ratio of building i's area to the total area, depending on the desired weighting) and $\sigma_{i,\beta0}^2$ is the variance of the $\beta_0$ coefficients for the ith building in the class. This results in a distribution of $I_{\beta0}$ values as follows:

$$I_{\beta0} \sim NID\left(w_i \Sigma_{\beta0}, \sum_{i=1}^{m} w_i(\sigma_{i,\beta0}^2 + \beta_{0,i}^2) - \mu_{GMM,\beta0}^2\right)$$

where $\Sigma_\beta$ is the covariance matrix of the model coefficients; the model coefficients are model parameters of the regression model. Probability density functions may also be generated in a similar way for the remaining building energy use model parameters (e.g., $\beta_1$, $\beta_2$, etc.) across the class of buildings.

In block 470, the probability density functions from the GMMs used in blocks 466, 468 may be stored in the electronic memory. Each set of probability density functions may be associated with its corresponding group of buildings in groups 446. For example, a probability density function may be determined for the $I_{NAC}$ values of schools located in temperate climates and stored in the memory.

Figure 4E:
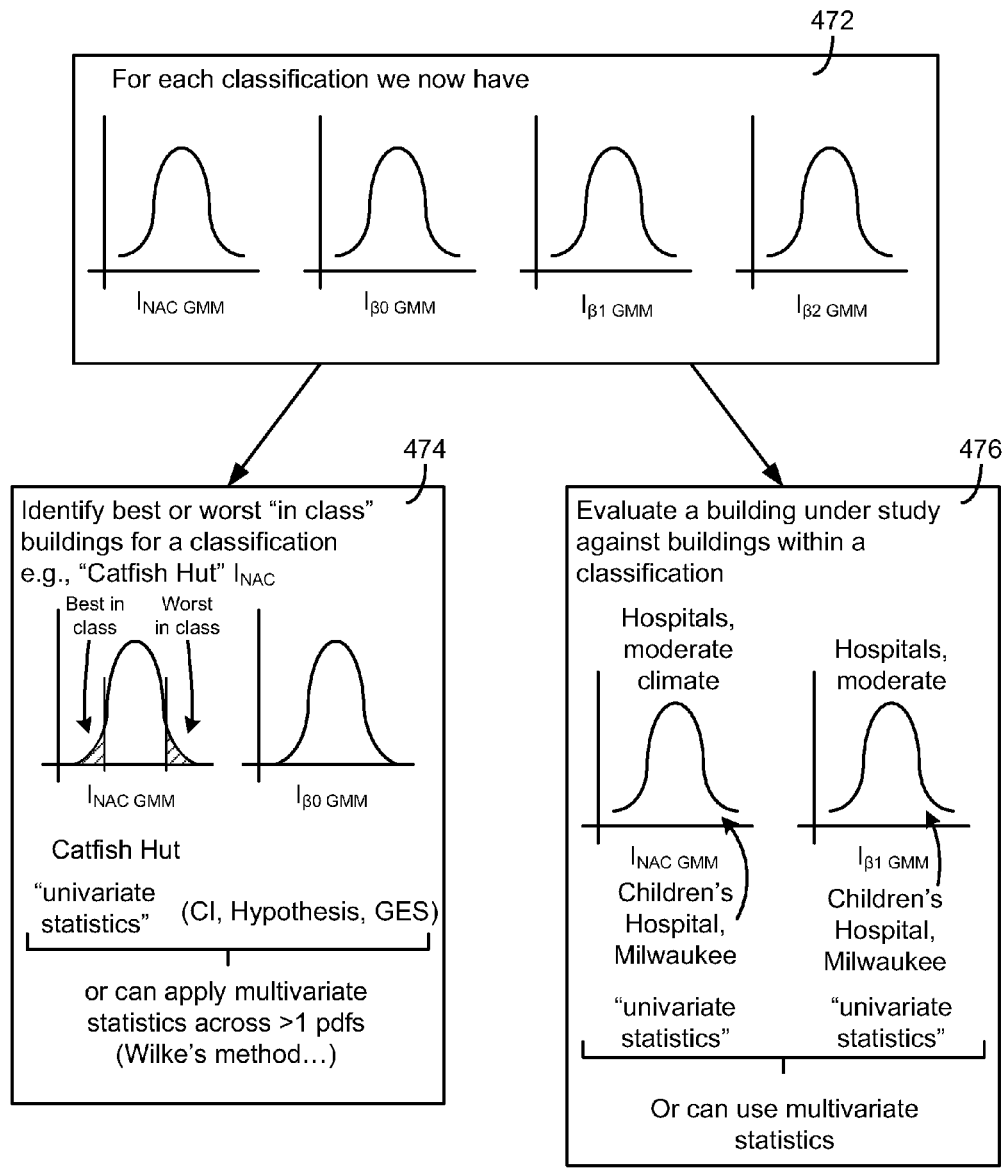

FIG. 4E shows the stored probability density functions for a classification being used to assess the performance of a building. Block 472 illustrates the probability density functions for the intensity values of the buildings in the class (e.g., the probability density functions determined in blocks 466, 468 and stored in memory in block 470). For example, assume that one of the groups of buildings includes data centers located in temperate climates. In such a case, probability density functions may exist from the GMMs for intensity values $I_{NAC}$, $I_{\beta0}$, $I_{\beta1}$, and $I_{\beta2}$. Using these functions, any number of different comparisons may be made among buildings in the class. In one example shown in block 474, best or worst in class buildings may be identified. In another example shown in block 476, a building under study may be compared to other buildings in its class.

Various techniques may be used to compare the buildings having a particular classification. For example, assume that one class of buildings includes buildings owned by the Catfish Hut franchise. In some embodiments, univariate analysis may be used to analyze the values in one of the probability density functions (e.g., the function for $I_{NAC}$, $I_{\beta0}$, $I_{\beta1}$, or $I_{\beta2}$). For example, confidence intervals, hypothesis testing, or the GESD method may be used on the $I_{NAC}$ probability density function to identify best or worst in class buildings. In other embodiments, two or more of the building statistics can be analyzed together using multivariate statistics (e.g., by determining a Mahalanobis distance, etc.).

In block 476, one or more of the probability density functions for the buildings in a class may be used to analyze a particular building under study. The building under study may have already been modeled and used to determine the probability density function for the class, or may have been recently modeled. For example, the energy consumption of Children's Hospital in Milwaukee, Wis. may be modeled and its intensity values compared to one or more of the probability density functions for the other buildings in its class. In some embodiments, univariate statistical analysis may be used to compare the building under study to one of the probability density functions. For example, the $I_{NAC}$ values for Children's Hospital may be compared to the $I_{NAC}$ probability density function for other hospitals located in a moderate climate. In other embodiments, multivariate analysis may be used to compare two or more intensity values for the building under study to corresponding multivariate probability density functions for the buildings in its class. For example, the joint $I_{NAC}$ and $I_{\beta0}$ for the building under study may be compared with the $I_{NAC}$ and $I_{\beta0}$ probability density functions for the buildings in its class using multivariate analysis (e.g., by determining a Mahalanobis distance, etc.).

Multivariate Analysis of Building Statistics

In various embodiments, multiple statistics derived from a building's energy use model may be compared to those of other buildings having the same classification. Similar to univariate analysis of a building's statistic, the comparison between statistics for a building under study and other buildings in its class may be used to detect abnormal energy consumption, identify potential candidates for ECMs, and set realistic expectations by implementing ECMs in the building. However, multivariate analysis allows different types of statistics to be analyzed at the same time. In other words, the different types of statistics for a building may be treated as a multivariate vector and compared to the vectors for the other buildings having the same classification.

Figure 5:
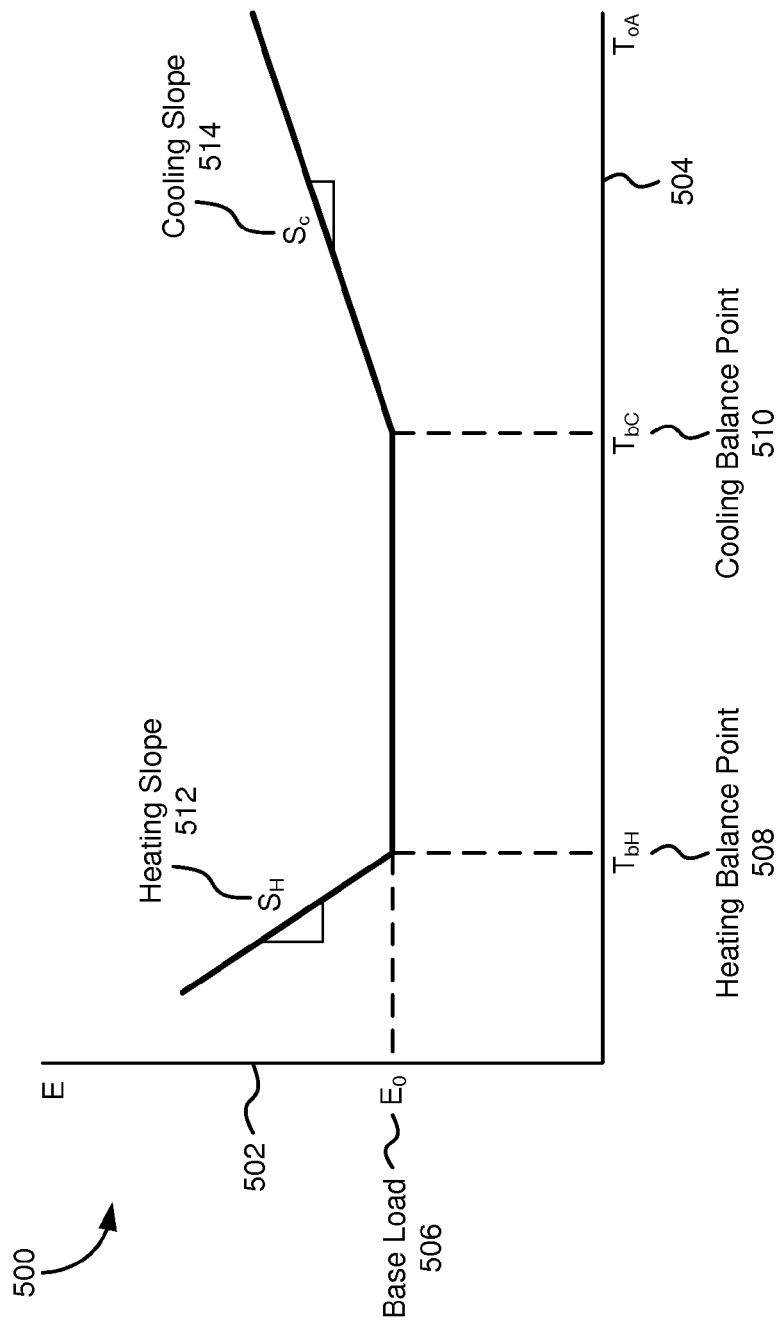
FIG. 5 is an illustration of temperature based energy model parameters, according to one embodiment.

Referring now to FIG. 5, an illustration 500 of temperature based energy model parameters is shown, according to one embodiment. In general, a number of different factors may affect the energy use of a building. For example, the outdoor air temperature of the building may affect the building's energy use (e.g., to heat or cool the building to a set point temperature). The building's energy use profile when cooling the building may also differ from the building's energy use profile when heating the building. In some embodiments, the building's energy use model may include parameters relating to both heating and cooling the building.

As shown in illustration 500, an x-y plot may be formed with a building's energy use (E) plotted along a first axis 502 and the outdoor air temperature ($T_{OA}$) plotted along a second axis 504. In various embodiments, the building's energy use plotted along axis 502 may be an energy consumption (e.g., measured in kWh) or an energy cost associated with the energy consumption of the building (e.g., by multiplying the consumption by a cost per consumption value in $/kWh). Such information may be obtained, for example, from billing data for the building from the utility providing the energy to the building. In one embodiment, the outdoor air temperature may be measured for a building using sensors located at or near the building over a particular time period.

A first parameter that may be used to model a building's energy use is its base energy load ($E_O$) 506. The base energy load ($E_O$) 506 may be referred to as a temperature based energy model parameter. In general, base energy load 506 corresponds to the energy use of the building at any given time that does not change with the outdoor air temperature. For example, base energy load 506 may be a function of the energy use of the building's lighting, computer systems, security systems, and other such electronic devices in the building. Since the energy consumption of these devices does not change as a function of the outdoor air temperature, base energy load 506 may be used to represent the portion of the building's energy use that is not a function of the outdoor air temperature.

In some embodiments, HDD and CDD values for a building may be calculated by integrating the difference between the outdoor air temperature of the building and a given temperature over a period of time. In one embodiment, the given temperature may be cooling balance point 510 for the building (e.g., to determine a CDD value) or heating balance point 508 for the building (e.g., to determine an HDD value). For example, assume that the cooling balance point for a building is 67° F. In such a case, the CDD value for the building over the course of a month may be calculated as follows:

$$CDD = \int^{month} \text{Max}\{0, (T_{OA} - T_{BE})\}dt$$

In other embodiments, a set reference temperature may be used to calculate a building's CDD or HDD value instead of the building's actual balance point. For example, a reference temperature of 65° F. may be used as a fixed value to compare with the building's outdoor air temperature. Thus, a CDD or HDD value may generally represent the amount of heating or cooling needed by the building over the time period.

A heating slope ($S_H$) 512 may correspond to the change in energy use or energy costs that result when the outdoor air temperature drops below a heating balance point 508 (e.g., a breakeven temperature). The heating slope ($S_H$) 512 may be a temperature based energy model parameter. For example, assume that heating balance point 508 for a building is 55° F. When the outdoor air temperature is at or above 55° F., only an energy expenditure equal to base load 506 may be needed to maintain the internal temperature of the building. However, additional energy may be needed, if the outdoor air temperature drops below 55° F. (e.g., to provide mechanical heating to the interior of the building). As the outdoor air temperature decreases, the amount of energy needed to heat the building likewise increases at a rate corresponding to heating slope 512.

Similar to heating balance point 508, a cooling balance point ($T_{bC}$) 510 may correspond to the outdoor air temperature at which additional energy beyond base energy load 506 is needed (e.g., the energy needed to provided mechanical cooling to the interior of the building). As the outdoor air temperature rises beyond cooling balance point 510, the amount of energy needed for cooling with also increase at a rate corresponding to cooling slope ($S_C$) 514. The cooling slope ($S_C$) 514 May be Referred to as a Temperature Based Energy Model parameter.

One potential energy use model that takes into account the various model parameters illustrated in illustration 500 is as follows:

$$E = \beta_0(\#days) + \beta_1(\text{CDD}) + \beta_2(\text{HDD}) + \epsilon$$

where E is the dependent variable representing the energy use or cost plotted along axis 502 in illustration 500. $\beta_0$ may be a base energy use, such as base energy load 506. $\beta_1$ may correspond to cooling slope 514 that, when multiplied by the CDD for a particular time, results in an energy use or cost attributable to cooling the building. Similarly, $\beta_2$ may correspond to heating slope 512 that, when multiplied by the HDD for a particular time, results in an energy use or cost attributable to heating the building. The value of $\epsilon$ may correspond to the amount of error or noise in the model. In some embodiments, the model may instead model the energy-related costs for the building by multiplying the building's energy use by a conversion factor (e.g., by multiplying by a cost factor measured in $/kWh). In further embodiments, the model may be normalized by dividing the model by the internal area of the building. For example, the model may model the normalized energy use (e.g., measured in kWh/ft$^2$) or normalized energy cost (e.g., measured in $/ft$^2$).

According to various embodiments, the various parameters used in a building energy use model may be represented as a multidimensional vector. For example, one vector may be defined as a five-dimensional vector as follows:

$$\phi_m = \begin{bmatrix} E_0 \\ S_H \\ S_C \\ T_{bH} \\ T_{bC} \end{bmatrix} \in R^5$$

In some embodiments, a vector of building energy use model parameters for a temperature based energy model (i.e., temperature based energy model parameters) for a particular building may be compared to those of other buildings having the same classification. For example, outlier values may be detected by using multivariate statistical analysis on the respective vectors.

Referring now to FIGS. 6A-6B, temperature based building energy use model parameters plotted along their respective dimensions are shown, according to various embodiments. In FIG. 6A, a single dimensional plot 600 of buildings' cooling balance points ($T_{bC}$) along an axis 602 is shown. In some embodiments, a building's cooling balance point may be compared to those of other buildings having the same classification. For example, a cooling balance point 604 may be compared to a set of cooling balance points 606 for other buildings having the same classification (e.g., based on the buildings' climates, usage types, etc.).

In FIG. 6B, a single dimensional plot 610 is shown of buildings' cooling slopes ($S_C$) along an axis 612. Similar to plot 600, a cooling slope 614 for a building under study may be compared to cooling slopes 616 for other buildings having the same classification. In some cases, cooling slopes 614, 616 in plot 610 may have corresponding cooling balance points 604, 606 in plot 600. For example, cooling slope 614 and cooling balance point 604 may be building energy use model parameters for a temperature based energy model for the same building under study.

According to some embodiments, outliers may be detected among the temperature based energy model parameters in plots 600, 610. However, the values of the buildings' parameters may be distributed such that clear-cut outliers may be difficult to detect via analysis in a single dimension (e.g., using univariate analysis). For example, cooling balance point 604 for the building under study may appear within the same cluster of values as cooling balance points 606 for the buildings having the same classification. Similarly, cooling slopes 614 for the building under study may appear within the same cluster of values as cooling slope 616 for the buildings having the same classification. In these and other cases, multivariate analysis may be used instead to detect outlier values among the energy use parameters of the buildings or other values that may be derived from their energy use models.

Figure 7:
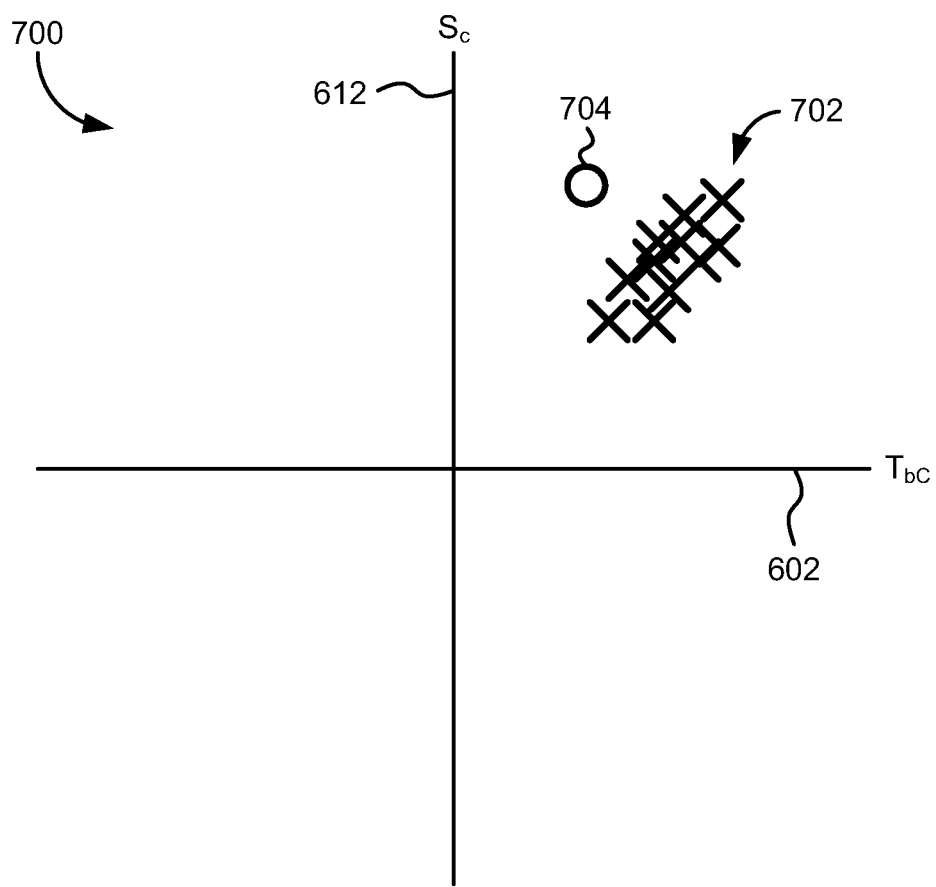
FIG. 7 is an illustration of a two-dimensional plot of the temperature based energy model parameters of FIGS. 6A-6B, according to various embodiments.

Referring now to FIG. 7, a two-dimensional plot 700 of building energy use model parameters for a temperature based energy model (i.e., temperature based energy model parameters) is shown, according to one embodiment. In the example shown, plot 700 includes axis 602 from FIG. 6A and axis 612 shown in FIG. 6B, thereby defining a two-dimensional plane. Temperature based energy model parameters may be represented as two-dimensional sets of values of the form ($S_C$, $T_{bC}$). For example, a building under study may have a pair of values 704 that correspond to cooling balance point 604 and cooling slope 614 in FIGS. 6A-6B. Buildings having the same classification as the building under study may also have pairs of values 702, corresponding to cooling balance points 606 and cooling slopes 616 in FIGS. 6A-6B.

In some embodiments, multivariate analysis may be used to detect outliers among the temperature based building energy use model parameters or among other values derived from the building energy use models. Multivariate outliers may be more prominent than univariate outliers, in some cases. For example, as shown in FIGS. 6A-6B, the cooling balance point and cooling slope parameters for the building under study may appear within the cluster of values for the other buildings when analyzed in a single dimension. However, when these parameters are analyzed together, outliers may be more prominent that in a unidimensional vector space.

As shown by plot 700, the pair of values 704 for the building under study appears more prominently as an outlier from the pairs of values 702, than if each parameter is analyzed separately. Thus, multivariate analysis alternatively may be used to compare the temperature based building energy use model parameters to those of one or more other buildings having the same classification. Temperature based energy model parameters (i.e., TEM parameters) may include, for example, $E_o$, $T_{b,C}$, $T_{b,H}$, $S_C$ and $S_H$. In addition, temperature based building energy use model parameters and heat transfer related parameters for a building may be interrelated. For example, a cooling slope may be defined as follows:

$$S_C = \frac{cc}{\eta_c}$$

where cc is a cooling coefficient function of ventilation and $\eta_c$ represents the building's cooling efficiency. Similarly, a building's cooling balance point may be defined as follows:

$$T_{bC} = T_{sp} - \frac{Q_i}{cc}$$

where $T_{sp}$ is a temperature set point for the building, $Q_i$ is the internal load of the building, and cc is the cooling coefficient function of ventilation also used to define the building's cooling slope.

For the building under study in plot 700, its pair of values 704 may be analyzed to determine that the building has an abnormally high ventilation, leading to its higher than normal cooling balance point. Similarly, the building's increased cooling slope may also be attributable to an abnormally high ventilation. Thus, outlier temperature based building energy use model parameters may be analyzed to detect abnormal energy consumption, in some embodiments.

Figure 8:
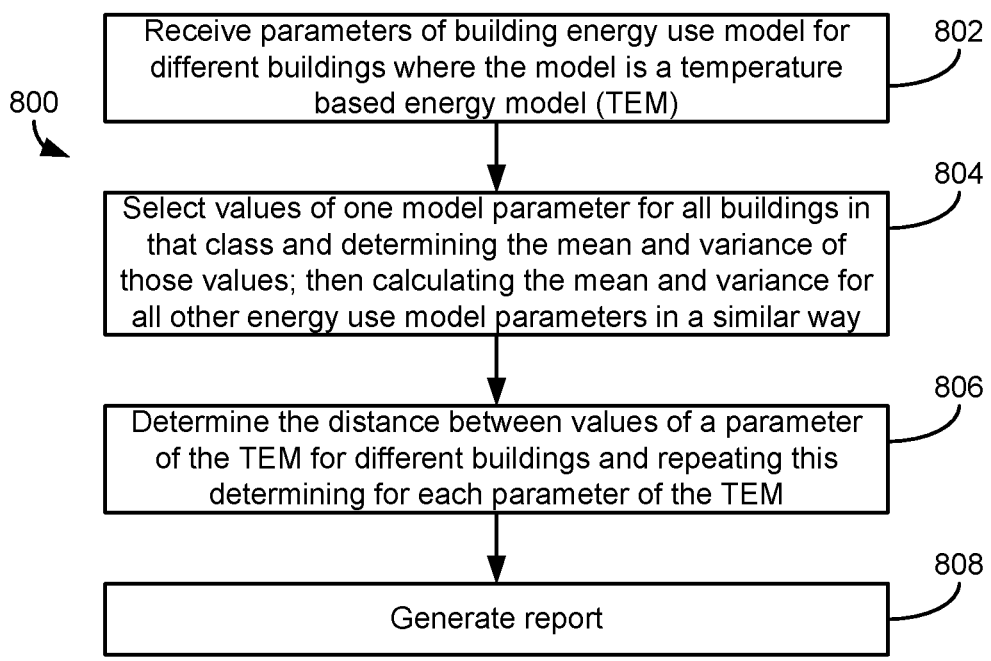
FIG. 8 is a flow chart of a process for comparing values related to a building's energy use model to those of other buildings, according to one embodiment.

Referring now to FIG. 8, a flow chart is shown of a process 800 for comparing temperature based building energy use model parameters in a building's energy use model to those of other buildings, according to one embodiment. Process 800 may be implemented by one or more computing devices, such as by a data acquisition and analysis service, a building's control system, or the like. In general, process 800 may use multivariate analysis to compare temperature based building energy use model parameters or other data that may be derived from the parameters.

Process 800 includes receiving parameters of temperature based building energy use models for different buildings (step 802). In some embodiments, the buildings may belong to the same class of buildings, based on their usage type, climate, or other factors. The data may be the actual parameters used in the temperature based energy models for the buildings. temperature based building energy use model parameters may include, but are not limited to, base energy load values, heating balance points, cooling balance points, heating slopes, and cooling slopes. Other values related to the temperature based building energy use model parameters, but not actually used in the models, may also be received and analyzed via process 800. For example, a building's cooling balance point may be related to the building's temperature set point and cooling load. One or both of these values may also be compared among buildings, to detect outliers and perform other such functions.

The energy use model for a building may model the actual energy use of the building or a value associated with the building's energy use, such as an energy use cost. For example, a temperature based building energy use model may model an energy consumption of a building or a cost associated with the energy consumption of the building. A conversion factor may be used to convert from one energy use metric to another. For example, a temperature based building energy use model that models a building's energy consumption may be converted into a model that models the energy costs of the building by multiplying by a cost per consumption value (e.g., a value measured in $/kWh). In some embodiments, the data may also be normalized across the set of buildings by dividing the parameters of the building energy use models by their buildings' respective areas.

Process 800 includes selecting values of one temperature based building energy use model parameter for all buildings in that class and determining the mean and variance of those values; then calculating the mean and variance for all other temperature based energy model parameters in a similar way (step 804). In some embodiments, the actual mean of the parameters may be used. In other embodiments, a robust estimator of the mean may be used. For example, the minimum covariance determinant method may be used to determine a robust estimate of the mean and covariance of a random sample of the received data. Such a method may be used to determine a robust estimate of the mean and covariance of the data, under the assumption that the data conforms to a multivariate normal distribution.

In one embodiment, the minimum covariance determinant method may be implemented as follows: first, randomly choose p+1 data, where p is the dimension of the data. The sample mean and covariance are then calculated as follows using h number of data points:

$$T_k = \frac{1}{p} \sum_i x_i$$

$$W_k = \frac{1}{p-1} \sum_i (x_i - T)(x_i - T)^T$$

where $T_k$ is the calculated mean for sample set, $x_i$ is the ith data point, and $W_k$ is the covariance. Next, the Mahalanobis distance ($d_i$) may be calculated for each data point ($x_i$) as follows:

$$d_i = (x_i - T_k)^T W_k^{-1} (x_i - T_k)$$

where $d_i$ is the Mahalanobis distance for each data point using the current values of $T_k$ and $W_k$. Next, $T_k$ and $W_k$ can be recalculated with the h number of data points having the smallest $d_i$. This may be repeated until the determinant of $W_k$ remains constant (e.g., det($W_k$)=c, where c is a constant). Once the determinant of $W_k$ remains constant with the current set of h data points, these calculations may be repeated iteratively using randomly selected initial starting points to find values of $T_k$ and $W_k$ having the smallest determinants. $W_k$ may then be scaled for statistical consistency.

Process 800 includes determining the distance between values of a parameter of the temperature based building energy use model for different buildings (step 806). The distance between values of a parameter from different buildings may be measured, for example, using a Mahalanobis distance or a Euclidean distance between the values of the parameter from different buildings. In some embodiments, a geometric centroid may be determined using the values of a parameter for the buildings and the distance calculated between each value of the parameter and the centroid. This determining the distance between values of a parameter of the temperature based energy model shall be repeated for each parameter of the temperature based building energy use model. In cases in which the Mahalanobis distance is used, the robust estimates of the mean and covariance determined in step 804 may be used (i.e., the $T_k$ and $W_k$ having the smallest determinant and scaled for consistency). In general, a Mahalanobis distance can be thought of as a statistical distance away from the typical building. If a robust estimate of the mean and covariance is not used, the Mahalanobis distance for each building may follow a Hotelling's T-squared distribution. Otherwise, h-p degrees of freedom may be used, instead of n-p degrees of freedom, where n is the total number of data points and h is the sample size used to calculate the robust estimates of the mean and covariance. If h and n are close in value, n-p may instead by used in some embodiments, since the difference will not significantly affect the resulting distribution.

Process 800 includes generating a report using the calculated distances for the buildings' data points (step 808). A generated report may include a graph, table, or other indication of the calculated distance between one of the buildings and those of the other buildings. For example, a calculated distance for a building under study may be included in the generated report. A report may also include a plot of the distances, in one embodiment. For example, a plot of the distances calculated for each building may be included in a generated report. A report may include any number of bivariate plots in which two of temperature based energy model parameters or other variables are treated as data points in two dimensions, such as in FIG. 7. Where more than two values for a building are compared to those of other buildings, a report may include a maximum of n choose 2 number of plots, where n is the number of data values being analyzed for a building. For example, a first bivariate plot may plot cooling slopes vs. heating balance points and a second bivariate plot may plot heating balance points vs. base energy loads.

Figure 9:
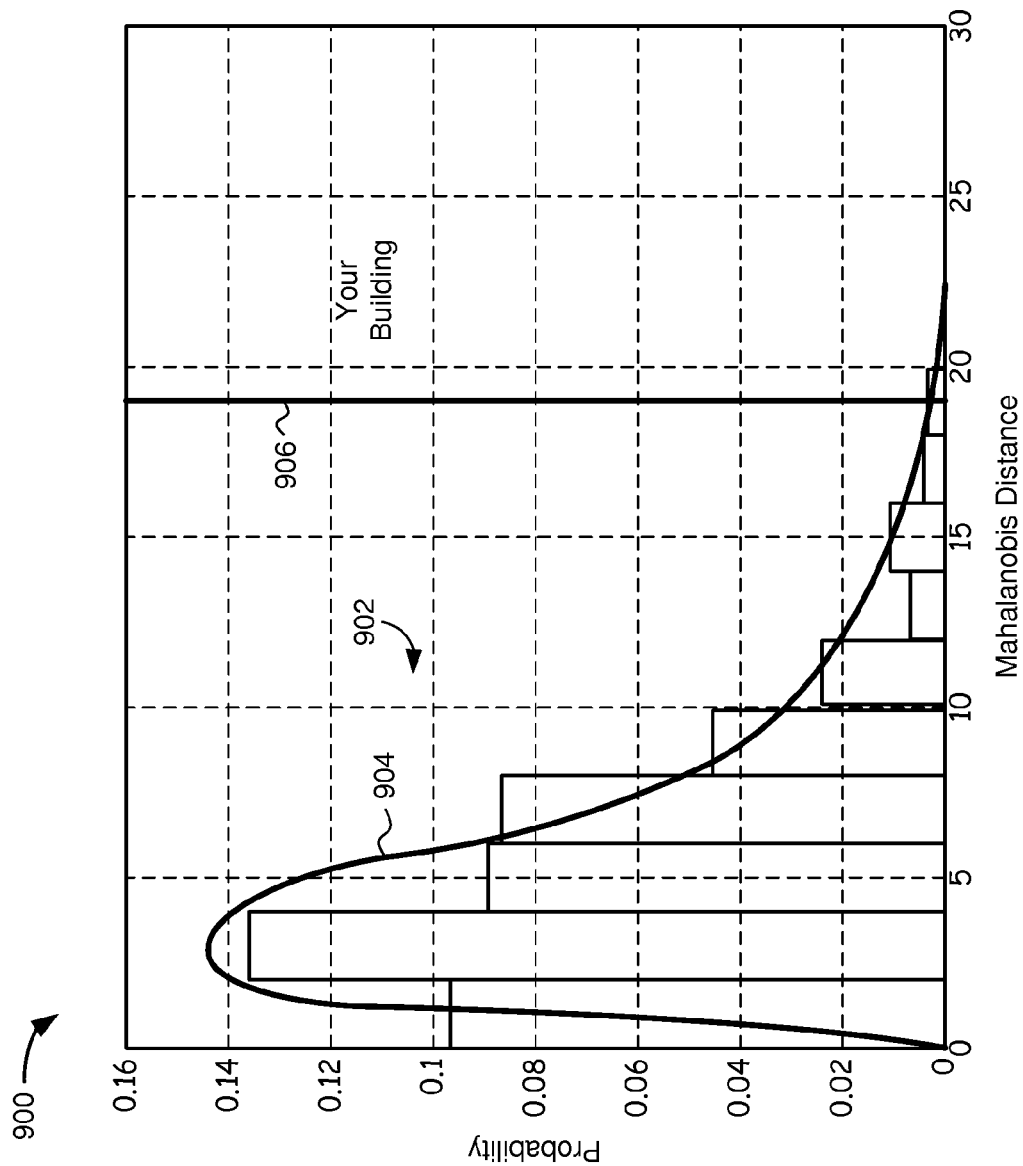
FIG. 9 is an illustration of an example plot comparing a temperature based energy model parameters to those of other buildings, according to one embodiment.

Referring now to FIG. 9, an illustration is shown of an example plot 900 comparing temperature based building energy use model parameters to those of other buildings, according to one embodiment. As shown, plot 900 includes a probability distribution function 902 of Mahalanobis distances for a building under study and a set of other buildings having the same classification. In general, the Mahalanobis distance for a building represents the distance between the value of a parameter of the temperature based building energy use model for the building and the value of the same parameter of the temperature based building energy use model for the typical building in the set. Probability distribution function 902 may follow a Hotelling's T-squared distribution 904 having an ellipsoidal envelope. Plot 900 may also include indicia 906 regarding the Mahalanobis distance for a building under study as it relates to probability distribution function 902. In general, the greater the Mahalanobis distance for a building, the further the value of a parameter of the temperature based building energy use model for the building varies from that of the typical building in its class. For example, indicia 906 may be inspected to determine that the building under study is a good candidate for ECMs or is experiencing a fault.

In some embodiments, generated plot 900 may include information regarding an outlier building detected by comparing the distance between the value of a parameter of the temperature based building energy use model for a building and those of other buildings. A building having a distance greater than a critical value may then be identified as being an outlier. For example, a critical value may correspond to a Mahalanobis distance of greater than a value V. In some embodiments, multiple hypothesis tests may be used to correct the distribution of distances. For example, multiple hypothesis tests may be used to detect outliers that are good candidates for ECMs or to limit false alarms during fault detection.

Figure 10:
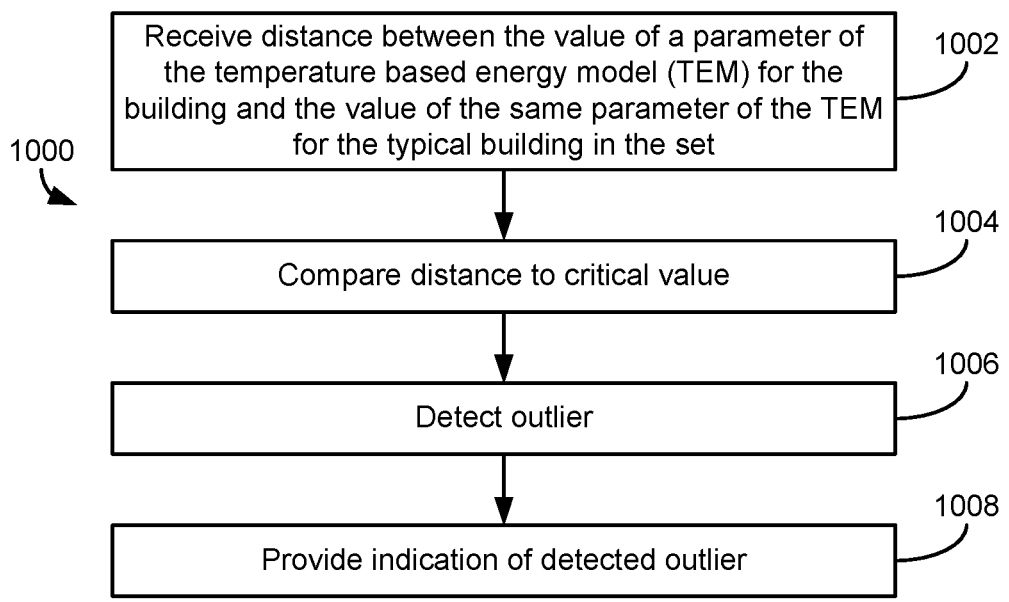
FIG. 10 is a flow chart of a process for identifying an outlier data point, according to one embodiment.

Referring now to FIG. 10, a flow chart of a process 1000 for identifying an outlier data point is shown, according to one embodiment. Process 1000 may be implemented by one or more computing devices, such as a data acquisition and analysis service. In general, an outlier may be detected by comparing the data points for a building under study to those of other buildings in its class. For example, parameters for a building energy use model may be compared to determine their statistical distances. These distances may then be compared to a critical value (e.g., a threshold value). Based on the comparison, a building having a distance greater than the critical value may be identified as being an outlier. Process 1000 may be used to detect outliers using univariate statistical analysis or multivariate statistical analysis, according to various embodiments.

Process 1000 includes receiving distances between the value of a parameter of temperature based building energy use model for the building and the value of the same parameter of the temperature based building energy use model for the typical building in the set (step 1002). In one embodiment, the distance between the value of a parameter of the temperature based building energy use model for the building and the value of the same parameter of the temperature based building energy use model for the typical building in the set may be received at a processing circuit (e.g., from another computing device or from a local software module being executed by the processing circuit). In general, the distances correspond to the statistical or geometric distances between the value of a parameter of the temperature based building energy use model for the building and the value of the same parameter of the temperature based building energy use model for the typical building in the set being analyzed (e.g., a building under study and one or more other buildings in its class). For example, the distances between the value of a parameter of the temperature based building energy use model for the building and the value of the same parameter of the temperature based building energy use model for the typical building in the set may be Mahalanobis distances calculated for the buildings being compared. In other examples, other distances may be received, such as geometric distances to a centroid or distances determined via hierarchical clustering. According to one embodiment, the distances generated in process 800 may be received and analyzed in process 1000.

Process 1000 includes comparing one or more of the received distances to a critical value (step 1004). Generally, a critical value refers to a threshold value that functions as the dividing line between outlier buildings and those within the cluster of normal buildings. In some embodiments, if the distances follow a distribution with curves of equal value of the probability distribution function that form hyperellipsoids, such as Hotelling's T-squared distribution, a critical value may be determined using an inverse T-squared distribution or F-distribution (e.g., a scaled T-squared distribution).

Process 1000 includes detecting an outlier (step 1006). Based on the comparison between the distance for a building and the critical value used, the building may be identified as being an outlier among the buildings being analyzed. For example, if the statistical distance between the value of a parameter of the temperature based building energy use model for a building under study and the value of the same parameter of the temperature based building energy use model for the average building in its class is greater than the critical value, the building may be considered an outlier.

Process 1000 includes providing an indication of the detected outlier (step 1008). In some embodiments, the indication may be part of a generated report and provided to an electronic display. For example, a plot of distances between values of a parameter of the temperature based building energy use model for different buildings may include an indication of which buildings are statistical outliers. In some cases, one or more bivariate scatter plots may be included in a generated report for the detected outlier. For example, if the building energy use model includes five variables, two of those variables may be plotted as part of a generated report.

A generated report may include financial information regarding the outlier, such as an energy use cost of the building. For example, a generated report may include information regarding monetary expenditures associated with the energy consumption of the building. A building's energy use cost may also be relative to the other buildings in its class. For example, the distance between the value of a parameter of the temperature based building energy use model for the building and the value of the same parameter of the temperature based building energy use model for the typical building in the set used in step 1004 may correspond to an additional expenditure over that of the other buildings in the set. In such a case, the additional expenditure may also be included in a generated report (e.g., to quantify the additional financial cost caused by the building being an outlier among its class).

In further embodiments, the indication may be provided to another software module or other computing device, for further analysis. For example, an indication of a detected outlier may be provided to another electronic device so that a technician may diagnose why the building is an outlier among its class. In another example, an indication of the detected outlier may be provided to a fault detection module configured to diagnose why the building is an outlier. The module may, for example, analyze any outlier variables for the building and suggest potential causes for the outlier variables. For example, such a fault detection module may suggest an abnormally high ventilation as a potential cause of the building having an outlier cooling balance point.

Fault Monetization and Parameter Mapping

In various embodiments, the impact of a fault in a building may be determined. Different types of faults may affect the energy consumption of a building differently. For example, a fault may have only a negligible impact on the energy consumption of the building while another fault may increase the energy consumption of the building by 25% or more. However, the relationship between a fault and a change in a building's energy consumption may not be immediately discernible by a human observer. For example, a building's energy consumption may increase for any number of different reasons (e.g., the presence of faults, an unexpected change in the building's occupancy, etc.). Similarly, the impact of a particular fault condition on the energy consumption of the building may not be readily apparent.

According to various embodiments, the lean energy analysis techniques described herein may be used to quantify the impact of a fault on a building's energy consumption and its corresponding financial impact. These techniques may be used to generate a building energy use model (e.g., a linear regression model) for a building using readily available data such as weather data and utility data (e.g., an energy consumption, a water consumption, etc.). Thus, a building's energy use may be modeled without requiring an expensive energy audit or deploying a large amount of sensors to monitor every aspect of the building.

Figure 11:
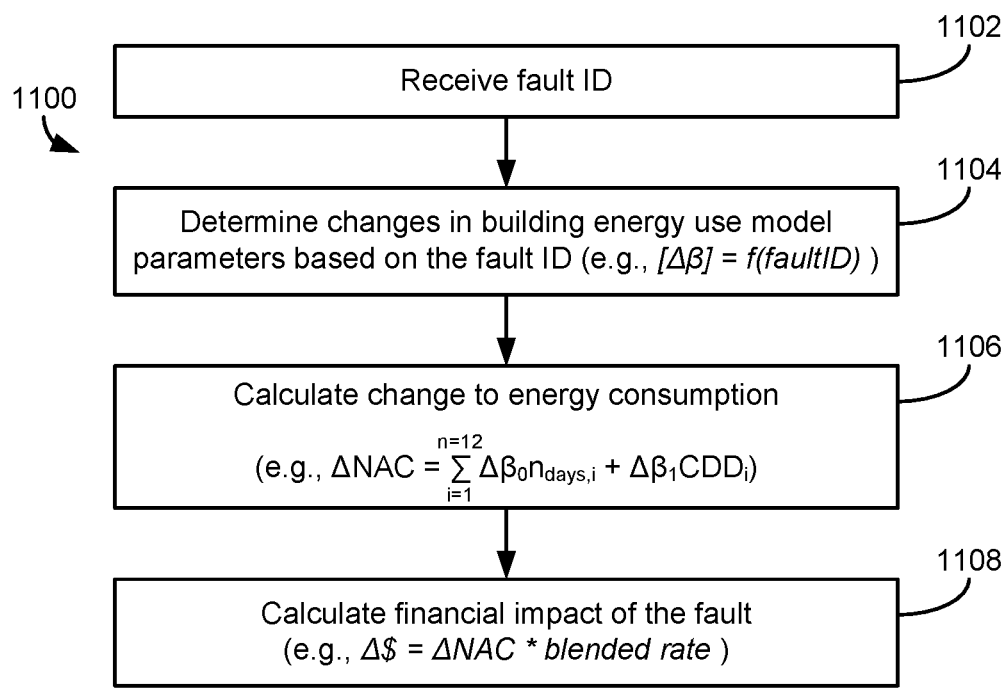
FIG. 11 is a flow chart of a process for determining a financial impact of a fault in a building, according to one embodiment.

Referring now to FIG. 11, a process 1100 for determining a financial impact of a fault in a building is shown, according to one embodiment. Process 1100 may be implemented either alone or in conjunction with any of the other processes disclosed herein. In various embodiments, process 1100 may be implemented by a processing circuit, such as processing circuit 200 shown in FIG. 2, a processing circuit of a data acquisition and analysis service, a processing circuit of a building's control system, etc.

Process 1100 includes receiving one or more fault identifiers (step 1102). A fault identifier may be any form of unique identifier used to represent a particular type of fault. For example, one fault identifier may correspond to a stuck damper and another fault identifier may correspond to a chiller's coefficient of performance being lower than a threshold. In some embodiments, a fault identifier may correspond to a fault identifier used in a building automation system. For example, a fault identifier may correspond to a fault identifier used in the Panoptix™ platform from Johnson Controls, Inc. In other embodiments, a received identifier may also refer to an operational inefficiency, a design inefficiency, or an ECM.

Process 1100 also includes determining changes in building energy use model parameters that result from the fault (step 1104). As described previously, a building's energy consumption may be modeled in a lean manner by using readily available data (e.g., weather data, utility billing data, etc.) in a linear regression model. Building energy use model parameters (e.g., 13 coefficients) can then be determined using an estimation technique, such as PLSR or another coefficient or parameter estimation technique. Faults that affect heat transfer related parameters (e.g., the amount of ventilation of the building's HVAC system, the efficiency of the building's heating or cooling systems, etc.) also likewise affect the building energy use model parameters.

Changes in building energy use model parameters that result from a particular fault may be determined using a mapping function between building energy use model parameters (e.g., temperature based building energy use model parameters) and the heat transfer related parameters of the building. For example, a coefficient matrix may be determined that relates the heat transfer related parameters of the building (e.g., the amount of ventilation or the efficiency of the cooling system, etc.) and the building energy use model parameters (e.g., the model's $\beta$ coefficients). Using the coefficient matrix, a change in the heat transfer related parameters that result from a particular fault condition may be mapped to a change in the building energy use model parameters. This process may be repeated for each fault condition under analysis to determine sets of changes in the building energy use model parameters (e.g., the resulting $\Delta\beta$ values), which may be stored in memory for further processing.

In one embodiment, the mapping function that maps changes in building energy use model parameters that result from a particular fault may be determined from first principle calculations. For example, if chiller efficiency has a known effect on the energy cost per cooling degree day then calculus can be used to find the derivative of the cost per cooling degree day with respect the chiller efficiency.

In another embodiment, the mapping function that maps changes in building energy use model parameters that result from a particular fault may be determined using an energy use simulator. An energy use simulator generally receives data describing the building under study. For example, the energy use simulator may receive data regarding the building's location, floor area, or any other data that may affect the energy consumption of the building. Exemplary energy use simulators include, but are not limited to, the EnergyPlus and DOE-2 simulators available from the U.S. Department of Energy and the Trace™ 700 program from Trane™. The energy use simulator may then determine a simulated energy consumption for the building based on the simulator's input data regarding the building. The simulated energy consumption and other EWS data (e.g., the building's floor area, weather data, etc.) may be used in one of the regression models described previously to determine the building energy use model parameters (e.g., the model's $\beta$ coefficients).

The input data to an energy use simulator may be systematically adjusted to reflect various fault conditions and the case in which no fault exists. The changes in the building energy use model parameters that result from a particular fault condition may correspond to the difference between the building energy use model parameters that result when no fault exists and the building energy use model parameters that result when the fault exists. For each fault condition being analyzed, a different set of changes in the building energy use model parameters (e.g., $\Delta\beta$ values) may be generated and stored.

Process 1100 includes calculating a change in the energy consumption of the building (step 1106). Once the changes in the building energy use model parameters of the building have been determined, they can be used to calculate the corresponding change in the building's annual energy consumption. For example, if a three parameter building energy use model is used to model the energy consumption of the building due to cooling the building, the change in its normalized annual consumption ($\Delta NAC$) may be determined as follows:

$$\Delta NAC = \sum_{i=1}^{12} \Delta\beta_o n_{days,i} + \Delta\beta_1 CDD_i$$

where $\Delta\beta_0$, $\Delta\beta_1$ are the changes in the building energy use model parameters determined in step 1104 based on a particular fault condition being present, n is number of days in the ith month, and CDD is a cooling degree day value for the ith month. In other embodiments, a three parameter building energy use model may be used to model the energy consumption of the building due to heating the building (e.g., by substituting the building's heating efficiency and heating degree day values into the above equation), a four parameter building energy use model may be used to model the energy consumption of the building for both heating and cooling in a building with a single balance point, or a five parameter building energy use model may be used to model the energy consumption of the building due to both heating and cooling in a building with distinct cooling and heating balance points.

Process 1100 also includes calculating a financial impact of the fault condition (step 1108). Once the change in the energy consumption of the building attributable to the fault condition has been determined, this change can be used to determine the financial impact of the fault. In one embodiment, the financial impact may be determined by multiplying the change in the energy consumption of the building by a blended utility rate. The blended utility rate may be obtained, for example, from the building's utility billing data. In further embodiments, additional data regarding the utility's service agreement may also be used to calculate the financial impact of the fault condition. For example, assume that the operator of a commercial building has an agreement with a utility company whereby the operator receives a discount if the building's annual consumption is within a certain range. If the change in the energy consumption would cause the building's annual consumption to fall outside of this range, the loss of the discount may also be included in the financial impact of the fault condition.

In an alternative embodiment, process 1100 may be adapted to instead determine a financial impact of an ECM. In a similar manner as described above, an identifier for an ECM may instead be received. For example, an ECM identifier may correspond to upgrading a building's economizer to an economizer having more sophisticated switch over logic. Changes in building energy use model parameters may then be determined based on the ECM and a corresponding change in the energy consumption of the building calculated. The financial savings of implementing the ECM may also be quantified by relating the change in the energy consumption of the building to a dollar amount.

Figure 12:
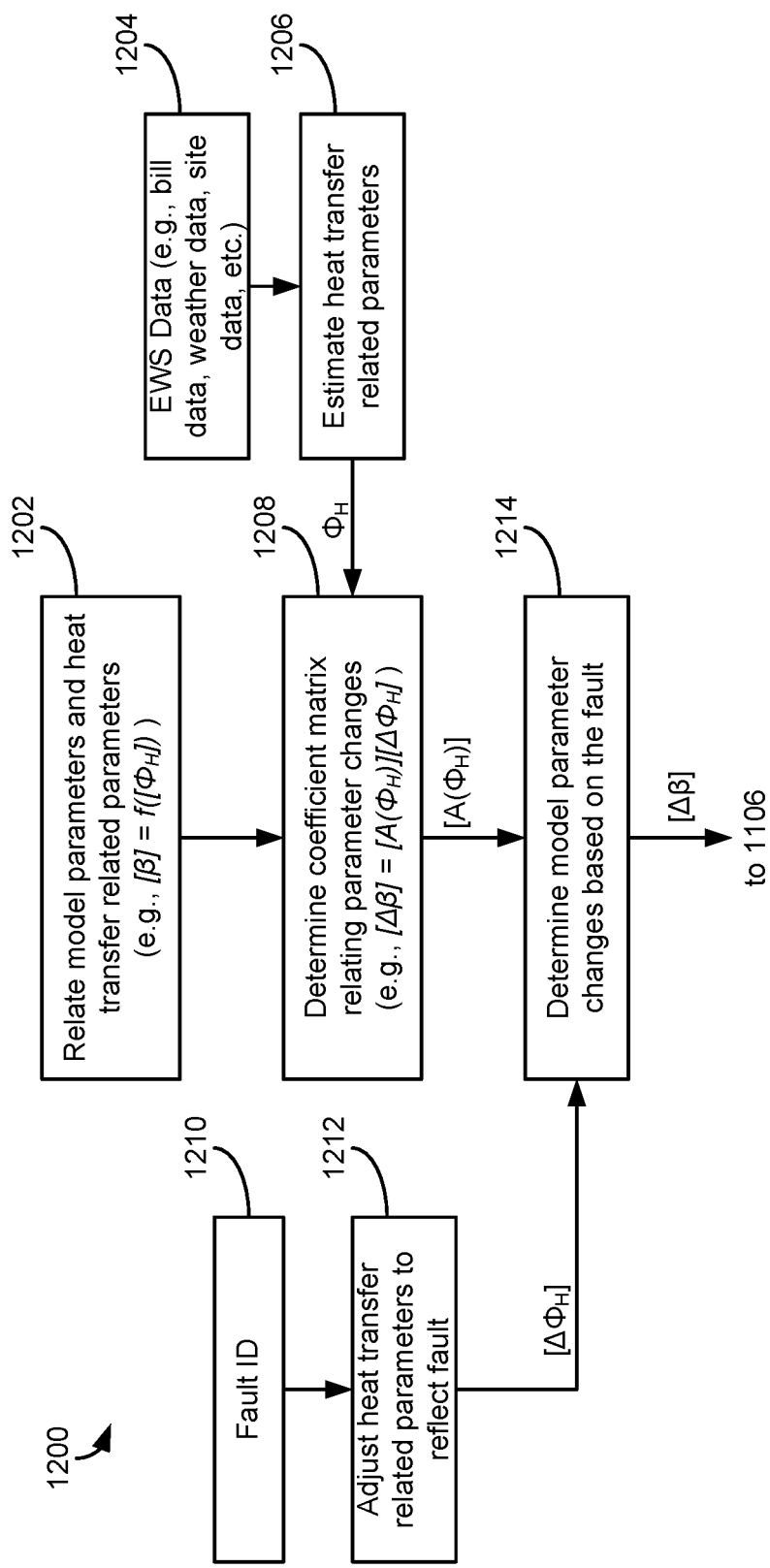
FIG. 12 is a flow chart of a process for mapping between changes in heat transfer related parameters and changes in building energy use model parameters, according to one embodiment.

Referring now to FIG. 12, a flow chart of a process 1200 for mapping between changes in heat transfer related (HTR) parameters and changes in building energy use model parameters is shown, according to an exemplary embodiment. Process 1200 may be implemented by a processing circuit configured to execute stored machine instructions. In one embodiment, process 1200 may be used in conjunction with process 1100 (e.g., to perform step 1104) to determine a financial impact of a fault condition. In further embodiments, process 1200 may be used in conjunction with a process to detect and diagnose faults.

Process 1200 includes relating building energy use model parameters and heat transfer related parameters representative of physical characteristics of the building (step 1202). As described in more detail with respect to FIG. 5, an energy use model for a building may take into account the building's base energy consumption, building's energy consumption attributable to heating the building, and/or the energy consumption of the building attributable to cooling the building. Thus, a building's energy consumption may be modeled using a three parameter building energy use model (e.g., to model the building's heating or cooling), a four parameter building energy use model (e.g., to model both heating and cooling in a building with a single break even temperature), or a five parameter building energy use model (e.g., to model both heating and cooling in a building with separate heating and cooling break even temperatures). For example, a five parameter building energy use model may be defined as follows:

$$E_i = \beta_0 n_{days,i} + \beta_1 \int_i \max(0, (T_{OA} - \beta_2)) dt + \beta_3 \int_i \max(0, (\beta_4 - T_{OA})) dt + \varepsilon$$

where $\beta_0$ is the building's base energy consumption ($E_0$), i is the ith month, $n_{days,i}$ is the number of days in the ith month, $\beta_1$ is the building's cooling slope ($S_C$), $\beta_2$ is the building's cooling break even temperature ($T_{bC}$), $\beta_3$ is the building's heating slope ($S_H$), $\beta_4$ is the building's heating break even temperature ($T_{bH}$), $T_{OA}$ is the outdoor air temperature, and $\varepsilon$ is an error value. The building's base energy consumption ($E_0$), the building's cooling slope ($S_C$), the building's heating slope ($S_H$), the building's heating break even temperature ($T_{bH}$), and the building's cooling break even temperature ($T_{bC}$) may collectively be referred to as temperature based energy model parameters. Thus, the parameters in this energy use model may be represented by a five-dimensional vector as follows:

$$\phi_M = \begin{bmatrix} E_0 \\ S_H \\ S_C \\ T_{bH} \\ T_{bC} \end{bmatrix} \in R^5$$

where $E_0$ is the building's base energy load, $S_H$ is the building's heating slope, $S_C$ is the building's cooling slope, $T_{bH}$ is the building's heating break even temperature, and $T_{bC}$ is the building's cooling break even temperature.

The building energy use model parameters are related to the heat transfer related parameters as follows:

$$C_C = UA + V_C \rho c_p$$

$$C_H = UA + V_H \rho c_p$$

$$S_C = \frac{C_C}{\eta_C}$$

$$S_H = \frac{C_H}{\eta_H}$$

$$T_{b,C} = T_{sp} - \frac{Q_i}{C_C}$$

$$T_{b,H} = T_{sp} - \frac{Q_i}{C_H}$$

where $C_c$ is the building's cooling coefficient (e.g., measured in kW/day*° F.), $C_H$ is the heating coefficient (e.g., measured in kW/day*° F.), U is the overall envelope conductance, A is the envelop area, $V_H$ is the sum of heating ventilation and infiltration flow rate, $V_C$ is the sum of cooling ventilation and infiltration flow rate, $\rho$ is the density of air, $c_p$ is the specific heat of air, $\eta_C$ is the cooling efficiency, $\eta_H$ is the heating efficiency, $T_{b,C}$ is the cooling break even temperature, $T_{b,H}$ is the heating break even temperature, $T_{sp}$ is the setpoint temperature of the building's HVAC system, and $Q_i$ is the internal building load (e.g., measured in kW/day). It is also assumed that the building's internal load ($Q_i$) is related to the building's base energy ($E_0$) plus a constant (c) as follows:

$$Q_i = E_0 + c$$

where c is also measured in (kW/day).

For purposes of mapping heat transfer related parameters to building energy use model parameters, a ventilation coefficient ($C_V$) may be used to account for both infiltration through the envelope and a minimum forced ventilation. Similarly, an economizer coefficient ($C_E$) may be used to account for the maximum forced ventilation through the building's economizer that is part of the building's HVAC system. Using these two coefficients gives the following:

$$C_C = UA + V_{min}\rho c_p$$

$$C_H = (V_{max} - V_{min})\rho c_p$$

$$S_C = \frac{C_V}{\eta_C}$$

$$S_H = \frac{C_V}{\eta_H}$$

$$T_{b,C} = T_{sp} - \frac{Q_i}{C_V + C_E}$$

$$T_{b,H} = T_{sp} - \frac{Q_i}{C_V}$$

where $V_{min}$ is the minimum volumetric flow rate through the economizer, $V_{max}$ is the maximum volumetric flow rate through the economizer, $C_v$ is the ventilation coefficient, and $C_E$ is the economizer coefficient. Based on these equations, the heat transfer related parameters may be represented as a six dimensional vector as follows:

$$\phi_B = \begin{bmatrix} C_V \\ C_E \\ T_{sp} \\ Q_i \\ \eta_C \\ \eta_H \end{bmatrix} \in R^6$$

Process 1200 also includes receiving EWS data (step 1204), which may be used to estimate heat transfer related parameters of a building (step 1206). The received EWS data may include billing data from a utility (e.g., energy consumption data, etc.), weather data (e.g., outdoor air temperature data), or site data (e.g., data regarding the building itself, such as floor area data, or the building's equipment, such as a setpoint temperature). The estimation of the heat transfer related parameters may be based in part on calculated balance points and may be accomplished in different ways according to different exemplary embodiments. According to one embodiment, a nonlinear least squares method (e.g., a Levenburg-Marquardt method) may be used to find the best calculated heat transfer related parameters. Such a method, for example, may use daily temperature and energy meter readings in the EWS data to calculate balance points. A nonlinear least squares method may then be applied to the balance points to generate and select the appropriate heat transfer related parameters.

According to another embodiment, an optimization scheme may be used to determine the best balance point or points. The optimization scheme may include an exhaustive search of the balance points, a gradient descent algorithm applied to the balance points to find a local minimum of the balance points, a generalized reduced gradient (GRG) method to determine the best balance point, or a cost function that is representative of the goodness of fit of the best balance point. The cost function may be an estimated variance of the model errors obtained from an iteratively reweighted least squares regression method, according to an exemplary embodiment. The iteratively reweighted least squares regression method is configured to be more robust to the possibility of outliers in the set of balance points generated and can therefore provide more accurate selections of heat transfer related parameters.

Process 1200 includes determining a coefficient matrix relating the heat transfer related parameters and building energy use model parameters (step 1208). As described previously, a vector of heat transfer related parameters may have more parameter values than a vector of building energy use model parameters. For example, a parameter vector for a five parameter building energy use model may have a corresponding six dimensional heat transfer related parameter vector. In one embodiment, assumptions may be made regarding some of the heat transfer related parameters such that the remaining heat transfer related parameters can be calculated. For example, it is possible to assume a temperature setpoint for the building (e.g., $T_{sp}=75°$ F.) and that its internal load is 50% greater than its base load (e.g., $Q_i=1.5*E_0$). These assumptions allow for the calculation of the remaining heat transfer related parameters (e.g., $C_V$, $C_E$, $\eta_C$, and $\eta_H$).

According to various embodiments, sensitivity analysis may be used to determine how a change in the heat transfer related parameters affects the building energy use model parameters or vice-versa. In one embodiment, changes in the heat transfer related parameters may be related to changes in the building energy use model parameters as follows:

$$\Delta S_C = \left(\frac{1}{\eta_C}\right)\Delta C_V - \left(\frac{C_V}{\eta_C^2}\right)\Delta \eta_C$$

$$\Delta S_H = \left(\frac{1}{\eta_H}\right)\Delta C_V - \left(\frac{C_V}{\eta_H^2}\right)\Delta \eta_H$$

$$\Delta T_{b,C} = \Delta T_{sp} - \left(\frac{1}{C_V + C_E}\right)\Delta Q_i + \left(\frac{Q_i}{(C_V + C_E)^2}\right)(\Delta C_V + \Delta C_E)$$

$$\Delta T_{b,H} = \Delta T_{sp} - \left(\frac{1}{C_V}\right)\Delta Q_i + \left(\frac{Q_i}{C_V^2}\right)\Delta C_V$$

$$\Delta E_0 = \Delta Q_i$$

These equations may alternatively be represented in matrix form as follows:

$$\begin{bmatrix} \Delta E_0 \\ \Delta T_{b,C} \\ \Delta T_{b,H} \\ \Delta S_C \\ \Delta S_H \end{bmatrix} =$$

$$\begin{bmatrix} 0 & 0 & 0 & 1 & 0 & 0 \\ \left(\frac{Q_i}{(C_V+C_E)^2}\right) & \left(\frac{Q_i}{(C_V+C_E)^2}\right) & 1 & \left(\frac{-1}{C_V+C_E}\right) & 0 & 0 \\ \left(\frac{Q_i}{C_V^2}\right) & 0 & 1 & \left(\frac{-1}{C_V}\right) & 0 & 0 \\ \left(\frac{1}{\eta_C}\right) & 0 & 0 & 0 & \left(\frac{-C_V}{\eta_H^2}\right) & 0 \\ \left(\frac{1}{\eta_H}\right) & 0 & 0 & 0 & 0 & \left(\frac{-C_V}{\eta_H^2}\right) \end{bmatrix}$$

$$\begin{bmatrix} \Delta C_V \\ \Delta C_E \\ \Delta T_{sp} \\ \Delta Q_i \\ \Delta \eta_C \\ \Delta \eta_H \end{bmatrix}$$

The above equation gives rise to a matrix (A) as follows:

$$\Delta \beta = \Delta \phi_M = A \Delta \phi_H$$

where A is a coefficient matrix that maps heat transfer related parameter changes to building energy use model parameters changes and vice-versa.

The columns in matrix (A) define the direction that a change in a heat transfer related parameter will cause a change in the building energy use model parameter space. In some embodiments, changes in building energy use model parameters may also be projected onto the subspace defined by a single column of the matrix A. Such a projection may be used, in one embodiment, to detect a fault by analyzing changes in building energy use model parameters. The corresponding changes in the heat transfer related parameters may then be identified as the cause or causes of the fault. For example, assume that the mean and covariance of the vector of the changes in the building energy use model parameters are known (e.g., the mean and covariance of $\Delta\phi_M$). Such a probability distribution function can be projected onto a subspace represented by the directions that the building energy use model parameters move when a single heat transfer related parameter changes. For example, assume that v is a column of the matrix A. A projection matrix (P) that projects a vector along the direction of column v can be built as follows:

$$P = \frac{vv^T}{v^T v} s$$

where $v^T$ is the transpose of the column. Assuming that only one heat transfer related parameter changes at a time, this projection matrix may be used to determine the heat transfer related parameter most likely to have caused the change in the building energy use model parameters as follows: 1) The change in building energy use model parameters is a statistic with a normal distribution, 2) The change in building energy use model parameters is projected on to the space defined by a column in A, 3) The distance from the origin is calculated by taking the dot product of the result of the projection with the unit vector in the direction of the column of A, 4) This is a new statistic x which is normally distributed as follows:

$$\Delta\phi_m \sim N(\mu_m, \Sigma_m)$$

$$x = \left(\frac{v^T}{\sqrt{v^T v}} P\right) \Delta \phi_m$$

$$x = \frac{v^T}{\sqrt{v^T v}} \Delta \phi_m$$

$$x \sim N\left(\frac{v^T}{\sqrt{v^T v}} \mu_m, \frac{1}{v^T v} v^T \Sigma_m v\right)$$

5) The statistic x is found for each column (i.e., for each possible change in heat transfer related parameters or fault), and 6) the most likely change in the heat transfer related parameters is the change associated with the column that achieved the x statistic with the greatest z score (number of standard deviations from the origin).

In cases in which multiple heat transfer related parameters may change at a single time, a projection in multiple dimensions may also be used representing the space spanned by the columns associated with two (or more changes). In this way it is possible to determine if the fault was likely caused by more than one change in the heat transfer related parameters. For example, if more than one change in heat transfer related parameters yielded a significant x statistic, then the changes in the building energy use model parameters could be projected onto one of the directions defined by a column in A along the other direction defined by a column in A if the resultant x statistic is still significant then the cause may be both of the heat transfer related parameters. If the resultant x is not significant, the cause may only be one of the heat transfer related parameters as they cannot be distinguished due to collinearity. Similar to the case in which only one heat transfer related parameter changes as a result of a fault, the two or more heat transfer related parameters that have changed may also be used to diagnose the cause of the fault.

Process 1200 includes receiving one or more fault identifiers (step 1210). A fault identifier may identify any type of fault within a building. For example, a fault identifier may correspond to a particular valve in the building's HVAC system being stuck. In various embodiments, a fault identifier may identify the piece of equipment in which the fault condition exists, the location of the equipment, or data regarding when the fault first occurred.

Process 1200 also includes adjusting the heat transfer related parameters of the building to reflect the one or more fault identifiers (step 1212). For example, a stuck damper in a building's economizer may affect the building's ventilation coefficient ($C_V$) or economizer coefficient ($C_E$). In one embodiment, a particular fault identifier may be mapped to a percentage change in heat transfer related parameters and stored within an electronic memory for future use (e.g., step 1212 may be performed as an offline process).

Process 1200 includes determining changes in building energy use model parameters based on the one or more fault identifiers (step 1214). Once a coefficient matrix (A) has been defined and changes in heat transfer related parameters ($\Delta\phi_H$) determined from one or more fault identifiers, the corresponding changes in the building energy use model parameters ($\Delta\beta$) may be determined (e.g., by solving $\Delta\beta = A\Delta\phi_H$). In some embodiments, process 1200 may be repeated systematically for different fault identifiers or combinations of fault identifiers. For example, a first set of model parameters may correspond to an outdoor air damper being stuck at >75% open, a second set of model parameters may correspond to a fan motor not working, and a third set of model parameters may correspond to both fault conditions existing simultaneously. In one embodiment, the resulting changes in the building energy use model parameters may be used as part of process 1100 to determine the financial impact of the faults.

Figure 13:
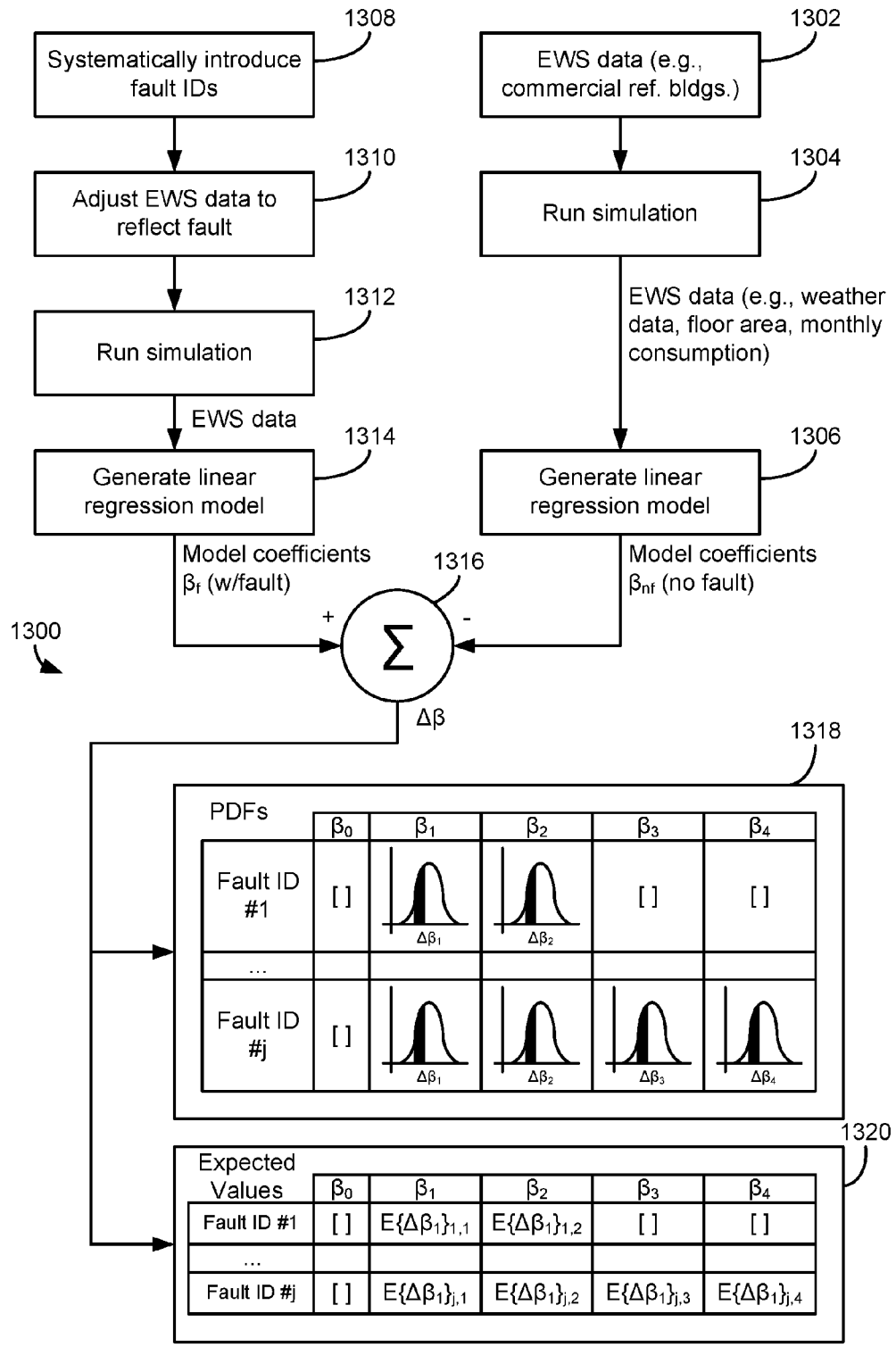
FIG. 13 is a flow chart of a process for using simulations to determine a change in building energy use model parameters from a fault condition, according to one embodiment.

Referring now to FIG. 13, a flow chart of a process 1300 for using simulations to determine a change in building energy use model parameters from a fault condition is shown, according to one embodiment. In contrast to process 1200, process 1300 utilizes a simulation utility to simulate the energy consumption of a building under various conditions. Fault conditions may be introduced and simulated to determine the effects of the faults on the building energy use model parameters. Process 1300 may be implemented by a processing circuit configured to execute stored machine instructions. In one embodiment, process 1300 may be used in conjunction with process 1100 (e.g., to perform step 1104) to determine a financial impact of one or more fault conditions being present in the building.

Process 1300 includes receiving EWS data (step 1302). In various embodiments, the EWS data may be tailored to the specific building under study or may be generic to a particular type of building. EWS data may include any form of data that may affect the energy use of the building. Exemplary EWS data may include, but is not limited to, the location of the building, the dimensions of the building, and the usage type of the building. In one embodiment, a generic definition may be selected for simulation based on the classification of the building under study. For example, assume that the building under study is a commercial box store located within a particular climate. In such a case, a generic definition may be used to represent all buildings within this classification. In one embodiment, a commercial reference building model available from the U.S. Department of Energy may be received. Such definitions may define different simulation parameters for buildings across typical usage types (e.g., hospital, supermarket, large office, etc.) and typical geographic locations (e.g., Miami, Chicago, Baltimore, etc.).

Process 1300 includes running a building energy simulation using the EWS data (step 1304). In general, a building energy simulator operates by using the received EWS data to simulate the building's thermal loads (e.g., a heating load or a cooling load) necessary to maintain a setpoint temperature. Based on these loads and the typical HVAC equipment used in the sample building, the simulator also determines an estimated energy consumption for the building. Exemplary energy simulators include, but are not limited to, the EnergyPlus and DOE-2 simulators available from the U.S. Department of Energy and the Trace™ 700 program from Trane™.

Process 1300 includes generating a linear regression model (step 1306). Once an estimated energy consumption has been determined by the simulator, EWS data including the simulated energy consumption may be used in a linear regression model. For example, the EWS data may include the weather data, floor area, and simulated energy consumption over a given period of time (e.g., a monthly energy consumption measured in kWh). These values may then be used in an energy use model that utilizes lean energy analysis to model the energy consumption of the building. For example, the building may be modeled as follows:

$$E=\beta_0(\#days)+\beta_1(CDD)+\beta_2(HDD)+\epsilon$$

The building energy use model parameters ($\beta_i$ values) may then be determined, in one embodiment, by solving the following linear regression model:

$$Y=X\beta+\epsilon, \quad \epsilon \sim N(0,\sigma^2 I)$$

by finding the vector $\hat{\beta}$ that minimizes the sum of squared error RSS:

$$RSS=\|Y-X\hat{\beta}\|^2$$

In other embodiments, different techniques to estimate the building energy use model parameters may be used (e.g., WLSR, PCR, PLSR, etc.). The resulting building energy use model parameters ($\beta_{nf}$ values) reflect the baseline situation in which the building has no faults present.

Process 1300 includes systematically introducing fault identifiers for analysis (step 1308). In step 1306, building energy use model parameters may be determined using a building energy simulator to model the situation in which no faults exist. To determine the effects of different faults or combinations of faults on the building energy use model parameters, different fault identifiers may be introduced. The fault identifiers may correspond to different types of faults. In various embodiments, a fault identifier may include data regarding when the fault first occurred, the equipment or component in which the fault exists, the location of the fault, or any other data that may be used to identify a fault in the building's equipment. The fault identifiers may correspond to fault identifiers used in the building's automation system (e.g., actual HVAC fault identifiers) or may be defined separately for this analysis. In one embodiment, only certain types of faults or combinations of faults are analyzed in process 1300. In other embodiments, faults of different types (e.g., faults in the building's economizer, faults in the building's chiller, etc.) may be analyzed in process 1300. In yet another embodiment, all of the building's potential faults may be analyzed in process 1300.

Process 1300 includes adjusting the EWS data to reflect a particular fault or a particular combination of faults (step 1310). The EWS data received in step 1302 may be changed to reflect any of the fault conditions being analyzed in process 1300. For example, a fault identifier may be received in step 1308 corresponding to a temperature sensor in an area of the building incorrectly measuring the area's temperature (e.g., the sensor adds 2° F. to the area's actual temperature). As a result, additional energy may be consumed by the building's HVAC system to maintain a setpoint temperature. In such a case, the fault may be modeled by adjusting the setpoint temperature for the area in the EWS data. For example, assume that the base setpoint temperature for the area is 70° F., but that the area's temperature sensor incorrectly offsets the measured temperature by +2° F. In such a case, the EWS data may be adjusted to reflect the fault by changing the setpoint temperature for the area to be 68° F. Other faults may be reflected in the EWS data in a similar manner by determining the effects of the fault and adjusting the EWS data accordingly.

Once the EWS data has been adjusted to reflect a particular fault or combination of faults, the adjusted EWS data may be used as an input to a building energy simulator (step 1312). The resulting EWS data (e.g., the building's simulated energy consumption, weather data, floor area, etc.) may then be used to determine the building energy use model parameters ($\beta_f$) values (step 1314), which reflect the building having the one or more fault conditions under analysis. In one embodiment, steps 1312, 1314 may be performed in a similar manner as steps 1304, 1306. For example, least squares regression may be used to determine the building energy use model parameters that result from a particular fault condition.

Process 1300 includes determining the effects of a fault or combination of faults on the building energy use model parameters (step 1316). In one embodiment, the effects of a fault or combination of faults may be determined as the difference between the building energy use model parameters where no fault exists (e.g., the $\beta_{nf}$ values calculated in step 1306) and the building energy use model parameters that result when the fault or combination of faults are present (e.g., the $\beta_f$ values calculated in step 1314). For example, a first difference value may be calculated as $\Delta\beta_0 = \beta_{nf,0} - \beta_{f,0}$. Any number of difference values may be determined in step 1316, depending on the type of building energy use model. For example, a cooling-only building energy use model may only utilize three parameters, while a building energy use model that models both heating and cooling may utilize five parameters.

Process 1300 may include generating probability distribution functions using the calculated building energy use model parameter differences (step 1318). In various embodiments, steps 1302-1316 may be repeated for any number of different building types, geographic locations, climates, or fault conditions. For example, a probability distribution function may reflect the distribution of one of the building energy use model parameters (e.g., $\beta_1$) given a particular type of fault (e.g., fault ID #1). In some embodiments, probability distribution functions may be calculated in step 1318 for different building classes (e.g., types of buildings) or geographic locations.

Process 1300 may also include determining expected changes in building energy use model parameters based on the fault identifiers (step 1320). In various embodiments, the probability distribution functions determined in step 1318 may be treated as random variable problems and point estimates may be determined in step 1320 (e.g., expected changes in the building energy use model parameters attributable to a fault). For example, a test statistic may be calculated (e.g., the mean, median, etc., of a probability distribution function) to determine an expected value (e.g., an expected $\Delta\beta$ value) for each of the building energy use model parameters broken down by fault identifier, geographic location, or building usage type. According to one embodiment, a regression technique may be used to detect whether a change in a building energy use model parameter is dependent on other building energy use model parameters. In some embodiments, a measure of the spread of the probability distribution functions (e.g., a standard deviation, a median absolute deviation, etc.) may also be calculated in step 1320 to determine a measure of the statistical confidence in the expected values. The expected changes in a building energy use model parameters that would result from a particular fault or combination of faults may be stored in an electronic memory for further use. In various embodiments, the expected changes in building energy use model parameters may also be used to determine a matrix that relates changes in heat transfer related parameters and weather data to changes in building energy use model parameters, such as matrix A discussed previously with respect to process 1200.

In one embodiment, the expected changes in building energy use model parameters may be used in step 1106 of process 1100 to determine a change in the energy consumption of the building that results when the fault or combination of faults exists. For example, if the fault corresponds to a temperature sensor being off by +2° F., the expected changes in the building energy use model parameters may be used to quantify the changes in the energy consumption of the building (e.g., to provide additional cooling to the area). The changes in the energy consumption of the building may also be used to quantify the additional financial cost to provide the extra cooling to the building. In another embodiment, the expected changes in building energy use model parameters may be used to perform fault diagnostics by projecting the changes in the building energy use model parameters onto the direction of a particular fault (as described previously).

Figure 14:
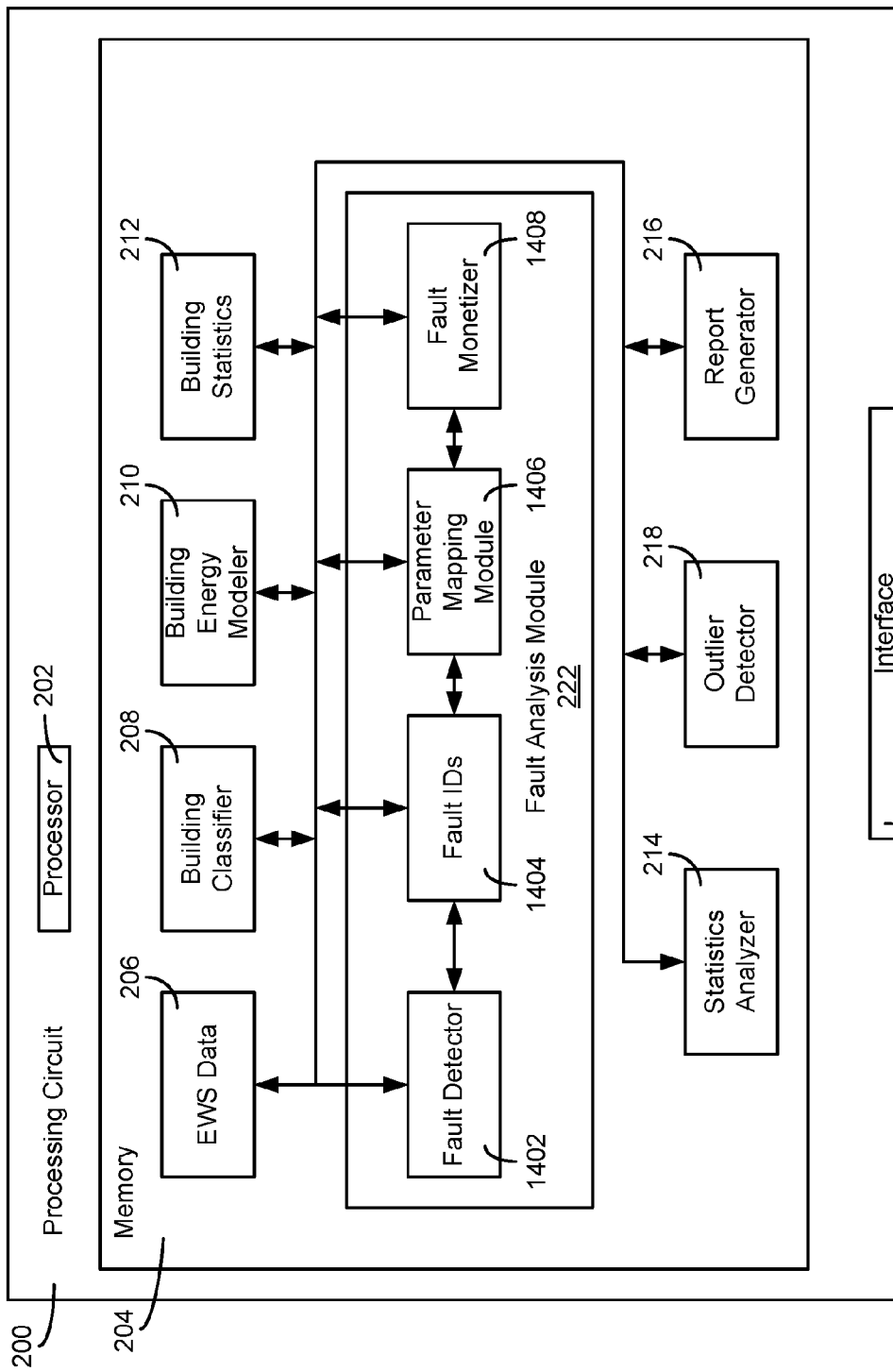
FIG. 14 is a detailed block diagram of the processing circuit of FIG. 2 configured to determine a financial impact of a fault condition, according to various embodiments.

FIG. 14 is a detailed block diagram of the processing circuit of FIG. 2 configured to determine a financial impact of a fault condition, according to an exemplary embodiment. As shown, fault analysis module 222 of processing circuit 200 may be configured to detect fault conditions, analyze fault conditions, or monetize fault conditions, according to various embodiments. Fault analysis module 222 may provide data to report generator 216, which generates various reports or alerts for review by a human operator. For example, fault analysis module 222 may generate a report that estimates the financial costs of a building's operator not fixing a particular type of fault.

Fault analysis module 222 may include a set of one or more fault identifiers 1404. Each of fault identifiers 1404 may correspond to a different type of fault or group of faults. For example, a fault identifier may correspond to a particular type of fault in a building's HVAC system. In one embodiment, fault identifiers 1404 correspond to fault identifiers used in the building's control systems or used by fault detector 1402. For example, fault identifiers 1404 may correspond to fault identifiers used in the Panoptix™ platform from Johnson Controls, Inc. In another embodiment, fault identifiers 1404 may be defined specifically for purposes of monetizing faults (e.g., a particular fault identifier may correspond to the situation in which an outdoor air damper is stuck and a pipe in the building's chiller is clogged).

Fault analysis module 222 includes a parameter mapping module 1406, according to various embodiments. In general, parameter mapping module 1406 is configured to map fault identifiers 1404 to changes in the building energy use model parameters used by building energy modeler 210. In some embodiments, parameter mapping module 1406 may simply store a mapping between fault identifiers 1404 and changes in building energy use model parameters. For example, the expected changes in building energy use model parameters due to one of fault identifiers 1404 may be predetermined by another computing device and stored as part of parameter mapping module 1406. In other embodiments, parameter mapping module 1406 may also be configured to determine the changes in the building energy use model parameters due to fault identifiers 1404.

In some embodiments, parameter mapping module 1406 is configured to utilize a statistical approach to determine changes in building energy use model parameters that result when a particular fault condition exists, such as the approach detailed in process 1300. Such a statistical approach may utilize a simulation program (e.g., EnergyPlus, DOE-2, or the like) to determine a simulated energy consumption given EWS data 206 and one or more of fault identifiers 1404. In one embodiment, EWS data 206 may be used to define the inputs to the simulation program. In another embodiment, standard building definition files may be used as proxies for actual buildings under analysis. The resulting energy consumptions from the simulator, as well as weather data, building type data, etc. may be provided to building energy modeler 210, which determines corresponding building energy use model parameters. This process may be repeated for different fault identifiers 1404 and for different building classifications used by building classifier 208. Parameter mapping module 1406 may determine changes in building energy use model parameters that result from fault identifiers 1404 by determining the difference between the building energy use model parameters where no fault exists and the building energy use model parameters where faults exist. Parameter mapping module 1406 may then use the changes in the building energy use model parameters to formulate probability distribution functions for the changes and to generate expected changes in building energy use model parameters when a particular fault condition exists.

According to some embodiments, parameter mapping module 1406 may utilize an analytical approach to determine the effects of fault identifiers 1404 on building energy use model parameters. For example, parameter mapping module 1406 may implement some or all of process 1200 shown in more detail in FIG. 12. In one embodiment, parameter mapping module 1406 may use a coefficient matrix to determine the fault or change in heat transfer related parameters (e.g., the building's heating efficiency, cooling efficiency, etc.) that caused changes in the building energy use model parameters (e.g., the building's base energy load, cooling break even temperature, etc.). Parameter mapping module 1406 may determine a change in the heat transfer related parameters that result from one of fault identifiers 1404.

Fault analysis module 222 may include fault monetizer 1408 configured to determine a change in a building's energy consumption that results from one of fault identifiers 1404. For example, fault monetizer 1408 may receive a set of changes in building energy use model parameters from parameter mapping module 1406 that result from one of fault identifiers 1404 and use the changes in the building energy use model parameters to calculate a change in the energy consumption of the building (e.g., a change in the building's normalized annual consumption). Fault monetizer 1408 may also determine a financial change associated with the change in the energy consumption of the building. For example, fault monetizer 1408 may multiply the change in the energy consumption of the building by a blended utility rate to determine a cost associated with one of fault identifiers 1404. In further embodiments, fault monetizer 1408 may also take into account any discounts, promotions, or negotiated prices affected by the change in the energy consumption of the building. Fault monetizer 1408 may be configured to project out the financial costs associated with one of fault identifiers 1404 or calculate different repair scenarios. For example, fault monetizer 1408 may determine financial costs due to additional energy consumptions, if the fault were to be repaired at different points in time.

Fault analysis module 222 may also include a fault detector 1402 configured to detect faults using lean energy analysis techniques. Such faults may correspond to fault identifiers 1404. Fault detector 1402 may, in some embodiments, make use of the energy use models of building energy modeler 210 to detect the existence of a fault. In one embodiment, fault detector 1402 may monitor how building energy use model parameters change over the course of time to detect a fault. Fault detector 1402 may determine whether a change in building energy use model parameters is statistically significant (e.g., outside of an acceptable range). If the changes are significant, fault detector 1402 may determine that a fault exists and generate an alert, log the fault for later review (e.g., as part of a report generated by report generator 216, or perform other functions.

In another embodiment, fault detector 1402 may detect the presence of a fault using peer analysis. For example, fault detector 1402 may utilize outlier detector 218 to determine whether a building has building energy use model parameters (e.g., β values) that are statistical outliers from those of the building's class. If a building has outlier building energy use model parameters, fault detector 1402 may determine that one or more faults may be present in the building and perform an appropriate action (e.g., flag the building for follow-up, log the potential fault, generate an alert, etc.).

Fault detector 1402 may also be configured to diagnose a potential fault, according to various embodiments. In addition to identifying a building as having a potential fault, fault detector 1402 may also determine the type of fault based on the building energy use model parameters. In some embodiments, parameter mapping module 1406 may be configured to map between changes in heat transfer related parameters and changes in building energy use model parameters in either direction. For example, parameter mapping module 1406 may utilize a coefficient matrix that may be used to determine changes in building energy use model parameters based on changes in heat transfer related parameters. In some embodiments, fault detector 1402 may project a change in building energy use model parameters onto a direction defined by the relationship between changes in building energy use model parameters and changes in heat transfer related parameters. Fault detector 1402 may also determine point estimates and variances for the changes. Fault detector 1402 may analyze a point estimate to variance ratio to determine which fault is the likely cause of the change in the building energy use model parameters. In one embodiment, fault detector 1402 may rank the ratios of means to standard deviations to determine the most likely fault (e.g., the highest ranked fault having the smallest mean to standard deviation ratio may be determined to be the most likely fault).

In embodiments where fault detector 1402 detects changes in building energy use model parameters, fault detector 1402 may provide the changes in the building energy use model parameters to parameter mapping module 1406, to determine the corresponding changes in the heat transfer related parameters. The most likely heat transfer related parameter to have changed may then be identified by fault detector 1402 as the cause of the fault.

In embodiments in which fault detector 1402 uses peer analysis for fault detection, fault detector 1402 may provide the difference between building energy use model parameters and the mean of its class to parameter mapping module 1406. In response, parameter mapping module 1406 may map the difference in building energy use model parameters to a change in heat transfer related parameters. Fault detector 1402 may then use the changes in the heat transfer related parameters to identify the source of the fault. For example, the heat transfer related parameter having a projected probability density function furthest from zero may be identified by fault detector 1402 as being the cause of the fault. In another example, the probability density functions of building energy use model parameters may be projected simultaneously onto two or higher dimensional subspaces, to avoid masking if building energy use model parameters change simultaneously.

Configuration of Various Exemplary Embodiments

Embodiments of the subject matter and the operations described in this specification can be implemented in digital electronic circuitry, or in computer software embodied on a tangible medium, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on one or more computer storage medium for execution by, or to control the operation of, data processing apparatus. Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, or other storage devices). Accordingly, the computer storage medium may be tangible and non-transitory.

The operations described in this specification can be implemented as operations performed by a data processing apparatus on data stored on one or more computer-readable storage devices or received from other sources.

The term "client or "server" include all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube), LCD (liquid crystal display), OLED (organic light emitting diode), TFT (thin-film transistor), plasma, other flexible configuration, or any other monitor for displaying information to the user and a keyboard, a pointing device, e.g., a mouse, trackball, etc., or a touch screen, touch pad, etc., by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an embodiment of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

While this specification contains many specific embodiment details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product embodied on a tangible medium or packaged into multiple such software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain embodiments, multitasking and parallel processing may be advantageous.

What is claimed is:

1. A method for evaluating a change in a building's energy consumption comprising:
   receiving an identifier for a change to the building, the identifier comprising at least one of a fault identifier and an identifier for an energy conservation measure;
   detecting, by a processing circuit, a change in heat transfer related parameters due to the change to the building;
   determining, by the processing circuit, a mapping between the change in the heat transfer related parameters and a change in building energy use model parameters, the building energy use model parameters being used in a building energy use model that models the energy consumption of the building; and
   calculating, by the processing circuit, a change in the energy consumption of the building using the building energy use model and the change in the building energy use model parameters that results from the change to the building.

2. The method of claim 1, further comprising:
   determining a financial cost associated with the change in the energy consumption of the building based on the change to the energy consumption of the building.

3. The method of claim 2, wherein the financial cost is determined based in part by multiplying the change in the energy consumption of the building by a blended utility rate.

4. The method of claim 1, wherein the identifier represents a fault, operational inefficiency, design inefficiency, or an energy conservation measure.

5. The method of claim 1, wherein the mapping is determined by taking the derivative of a relationship between changes in the building energy use model parameters and changes in the heat transfer related parameters.

6. The method of claim 1, wherein determining the mapping comprises:
   executing, by the processing circuit, a building energy simulator to determine a simulated energy consumption value based on energy consumption, weather, and site (EWS) data;
   using the simulated energy consumption value in the building energy use model to determine a first set of building energy use model parameters;
   adjusting the EWS data to reflect the change to the building;
   executing the building energy simulator to determine a second simulated energy consumption value based on the adjusted EWS data;
   determining a second set of building energy use model parameters using the second simulated energy consumption value; and
   using the first and second sets of building energy use model parameters to determine the change in the building energy use model parameters that results from the change to the building.

7. The method of claim 6, wherein the change in the building energy use model parameters that results from the change to the building are determined by mapping the change in the building energy use model parameters to the heat transfer related parameters detected during building fault conditions.

8. A method for diagnosing the causes of a change in building energy use model parameters for a building comprising:
   detecting, by a processing circuit, a change in heat transfer related parameters due to a change to the building;
   determining, by the processing circuit, a mapping between the change in the heat transfer related parameters and the change in the building energy use model parameters, wherein the mapping is defined by a coefficient matrix A;
   receiving a mean $\mu_m$ and a covariance $\Sigma_m$ of a vector $\Delta\Phi_m$ representing the change in the building energy use model parameters;
   projecting the vector $\Delta\Phi_m$ representing the change in the building energy use model parameters onto a direction defined by the coefficient matrix A; and
   determining, by the processing circuit, a normalized statistic x comprising the mean $\mu_m$ and a covariance $\Sigma_m$ projected onto the direction defined by the coefficient matrix A.

9. The method of claim 8, further comprising:
   repeating the 'determining,' 'receiving,' 'projecting' and determining steps for each of a plurality of other changes to the building to determine a normalized statistic x corresponding to each change to the building; and
   determining a most likely cause of the change in the building energy use model parameters by comparing the normalized statistics x corresponding to each change to the building.

10. The method of claim 9, further comprising:
taking the derivative of a relation between the change in the building energy use model parameters and the change in the heat transfer related parameters to determine the mapping.

11. The method of claim 8, wherein the mapping from the change to the building to the change in the building energy use model parameters is found by:
executing, by the processing circuit, a building energy simulator to determine a simulated energy consumption based on energy consumption, weather, and site (EWS) data;
using the simulated energy consumption value in the building energy use model to determine a first set of building energy use model parameters;
adjusting the EWS data to reflect the change to the building;
executing the building energy simulator to determine a second simulated energy consumption value based on the adjusted EWS data;
determining a second set of building energy use model parameters using the second simulated energy consumption value; and
using the first and second sets of building energy use model parameters to determine the change in the building energy use model parameters that results from the change to the building.

12. A system for evaluating a change in a building's energy consumption comprising a processing circuit configured to:
receive an identifier for a change to the building, the identifier comprising at least one of a fault identifier and an identifier for an energy conservation measure;
detect a change in heat transfer related parameters due to the change to the building;
determine a mapping between the change in the heat transfer related parameters and a change in building energy use model parameters, the building energy use model parameters being used in a building energy use model that models the energy consumption of the building; and
calculate a change in the energy consumption of the building using the building energy use model and the change in the building energy use model parameters that results from the change to the building.

13. The system of claim 12, wherein the processing circuit is configured to:
determine a financial cost associated with the change in the energy consumption of the building based on the change to the energy consumption of the building.

14. The system of claim 13, wherein the financial cost is determined based in part by multiplying the change in the energy consumption of the building by a blended utility rate.

15. The system of claim 12, wherein the identifier represents a fault, operational inefficiency, design inefficiency, or an energy conservation measure.

16. The system of claim 12, wherein the mapping is determined by taking the derivative of a relationship between changes in the building energy use model parameters and changes in the heat transfer related parameters.

17. The system of claim 12, wherein the processing circuit is configured to determine the mapping by:
executing a building energy simulator to determine a simulated energy consumption value based on energy consumption, weather, and site (EWS) data;
using the simulated energy consumption value in the building energy use model to determine a first set of building energy use model parameters;
adjusting the EWS data to reflect the change to the building;
executing the building energy simulator to determine a second simulated energy consumption value based on the adjusted EWS data;
determining a second set of building energy use model parameters using the second simulated energy consumption value; and
using the first and second sets of building energy use model parameters to determine the change to the building energy use model parameters that results from the change to the building.

18. The system of claim 17, wherein the change in the building energy use model parameters that results from the change to the building are determined by mapping the change in the building energy use model parameters to the heat transfer related parameters detected during building fault conditions.

19. A system for diagnosing the cause of a change in building energy use model parameters for a building comprising a processing circuit configured to:
detect a change in heat transfer related parameters due to a change to the building;
determine a mapping between the change in the heat transfer related parameters and change in the building energy use model parameters, wherein the mapping is defined by a coefficient matrix A;
receive a mean $\mu_m$ and a covariance $\Sigma_m$ of a vector $\Delta\Phi_m$ representing the change in the building energy use model parameters;
project the vector $\Delta\Phi_m$ representing the change in the building energy use model parameters onto a direction defined by the coefficient matrix A; and
determine a normalized statistic x comprising the mean $\mu_m$ and a covariance $\Sigma_m$ projected onto the direction defined by the coefficient matrix A.

20. The system of claim 19, wherein the processing circuit is configured to:
repeat the 'determine,' 'receive,' 'project' and determine steps for each of a plurality of other changes to the building to determine a normalized statistic x corresponding to each change to the building; and
determine a most likely cause of the change in the building energy use model parameters by comparing the normalized statistics x corresponding to each change to the building.

21. The system of claim 20, wherein the processing circuit is configured to take the derivative of the relation between the change in the building energy use model parameters and the change in the heat transfer related parameters to determine the mapping.

22. The system of claim 19, wherein the processing circuit is configured to determine the mapping by:
executing a building energy simulator to determine a simulated energy consumption based on energy consumption, weather, and site (EWS) data;
using the simulated energy consumption value in the building energy use model to determine a first set of building energy use model parameters;
adjusting the EWS data to reflect the change to the building;
executing the building energy simulator to determine a second simulated energy consumption value based on the adjusted EWS data;

determining a second set of building energy use model parameters using the second simulated energy consumption value; and using the first and second sets of building energy use model parameters to determine the change in the building energy use model parameters that results from the change to the building.

23. A method for relating changes in heat transfer related parameters for a building to changes in building energy use model parameters for the building comprising:

receiving changes in the heat transfer related parameters, the changes in the heat transfer related parameters representing physical changes to the building;

receiving changes in the building energy use model parameters;

determining, by a processing circuit, a mapping between the changes in the heat transfer related parameters and the changes in building energy use model parameters;

determining, by the processing circuit, a new change to the heat transfer related parameters that results from a fault condition;

using the new change in the heat transfer related parameters that results from the fault condition and the mapping to determine a corresponding new change in the building energy use model parameters; and determining, by the processing circuit, a change to an energy consumption that results from the fault condition based on the new change in the building energy use model parameters.

24. The method of claim 23, wherein the heat transfer related parameters comprise at least one of: a cooling coefficient, an economizer coefficient, a temperature setpoint, a heating efficiency, a cooling efficiency, or an internal building load.

25. The method of claim 23, wherein the energy use model parameters comprise at least one of: a base energy use, a cooling slope, a heating slope, a cooling balance point, or a heating balance point.

26. The method of claim 23, further comprising:
detecting by the processing circuit, change in the building energy use model parameters; and
detecting the existence of a fault condition using a detected change to the building energy use model parameters.

27. The method of claim 26, further comprising:
determining a new change in the heat transfer related parameters due to the detected change in the building energy use model parameters using the mapping; and
identifying the new change in the heat transfer related parameters due to the detected change in the building energy use model parameters as the source of the fault condition.

28. The method of claim 23, further comprising:
performing peer analysis of building energy use model parameters for a class of buildings;
determining, by the processing circuit, building energy use model parameters of a building in the class to be an outlier; and
detecting the existence of a fault condition in the building based on the building energy use model parameters of the building being determined to be the outlier.

29. The method of claim 28, further comprising:
determining a difference between the outlier building energy use model parameters and a mean of the building energy use model parameters of the class of buildings;
using the mapping to map the difference to a corresponding new change in the heat transfer related parameters; and
identifying a source of the fault condition using the corresponding new change in the heat transfer related parameters.

30. The method of claim 23, further comprising:
determining a new change in the heat transfer related parameters attributable to an energy conservation measure;
using the mapping and the new change in the heat transfer related parameters attributable to the energy conservation measure to determine a corresponding new change in the building energy use model parameters; and
calculating an energy consumption savings based on the corresponding new change in the building energy use model parameters.

* * * * *